United States Patent
Saida et al.

(10) Patent No.: US 8,488,375 B2
(45) Date of Patent: Jul. 16, 2013

(54) MAGNETIC RECORDING ELEMENT AND NONVOLATILE MEMORY DEVICE

(75) Inventors: Daisuke Saida, Tokyo (JP); Minoru Amano, Kanagawa-ken (JP); Junichi Ito, Kanagawa-ken (JP); Yuichi Ohsawa, Kanagawa-ken (JP); Saori Kashiwada, Kanagawa-ken (JP); Chikayoshi Kamata, Kanagawa-ken (JP); Shigeki Takahashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 252 days.

(21) Appl. No.: 13/037,592

(22) Filed: Mar. 1, 2011

(65) Prior Publication Data

US 2012/0068281 A1    Mar. 22, 2012

(30) Foreign Application Priority Data

Sep. 17, 2010    (JP) .................................. 2010-209390

(51) Int. Cl.
*G11C 11/14*    (2006.01)

(52) U.S. Cl.
USPC ........... 365/171; 365/148; 365/158; 365/173; 977/933; 977/935

(58) Field of Classification Search
USPC ................. 365/48, 55, 62, 66, 74, 78, 80–93, 365/100, 130, 131, 148, 158, 171–173, 209, 365/213, 225.5, 230.07, 232, 243.5; 257/295, 257/421, 422, 427, E21.665, E27.006; 438/3; 977/933–935
See application file for complete search history.

(56) References Cited

U.S. PATENT DOCUMENTS

| | | | |
|---|---|---|---|
| 7,307,302 B2* | 12/2007 | Saito ............................. | 257/295 |
| 7,615,996 B1* | 11/2009 | Machita et al. ............... | 324/252 |
| 7,663,197 B2* | 2/2010 | Nagase et al. ................ | 257/421 |
| 7,957,179 B2* | 6/2011 | Ding et al. .................... | 365/158 |
| 2007/0086121 A1* | 4/2007 | Nagase et al. ............. | 360/324.1 |
| 2007/0297220 A1* | 12/2007 | Yoshikawa et al. .......... | 365/158 |
| 2009/0015958 A1 | 1/2009 | Nakamura et al. | |
| 2010/0214835 A1* | 8/2010 | Ding et al. .................... | 365/173 |

FOREIGN PATENT DOCUMENTS

JP    2009-21352    1/2009

OTHER PUBLICATIONS

U.S. Appl. No. 13/227,959, filed Sep. 8, 2011, Saida, et al.
U.S. Appl. No. 13/228,040, filed Sep. 8, 2011, Saida, et al.
U.S. Appl. No. 13/416,076, filed Mar. 9, 2012, Saida, et al.
U.S. Appl. No. 13/416,724, filed Mar. 9, 2012, Saida, et al.
U.S. Appl. No. 13/416,408, filed Mar. 9, 2012, Saida, et al.
U.S. Appl. No. 13/210,678, filed Aug. 16, 2011, Daibou, et al.

* cited by examiner

*Primary Examiner* — Harry W Byrne
(74) *Attorney, Agent, or Firm* — Oblon, Spivak, McClelland, Maier & Neustadt, L.L.P.

(57) ABSTRACT

According to one embodiment, a magnetic recording element includes a stacked body including a first stacked unit and a second stacked unit. The first stacked unit includes a first ferromagnetic layer, a second ferromagnetic layer and a first nonmagnetic layer. Magnetization of the first ferromagnetic layer is substantially fixed in a first direction being perpendicular to a first ferromagnetic layer surface. The second stacked unit includes a third ferromagnetic layer, a fourth ferromagnetic layer and a second nonmagnetic layer. Magnetization of the fourth ferromagnetic layer is substantially fixed in a second direction being perpendicular to a fourth ferromagnetic layer surface. The first direction is opposite to the second direction.

20 Claims, 20 Drawing Sheets

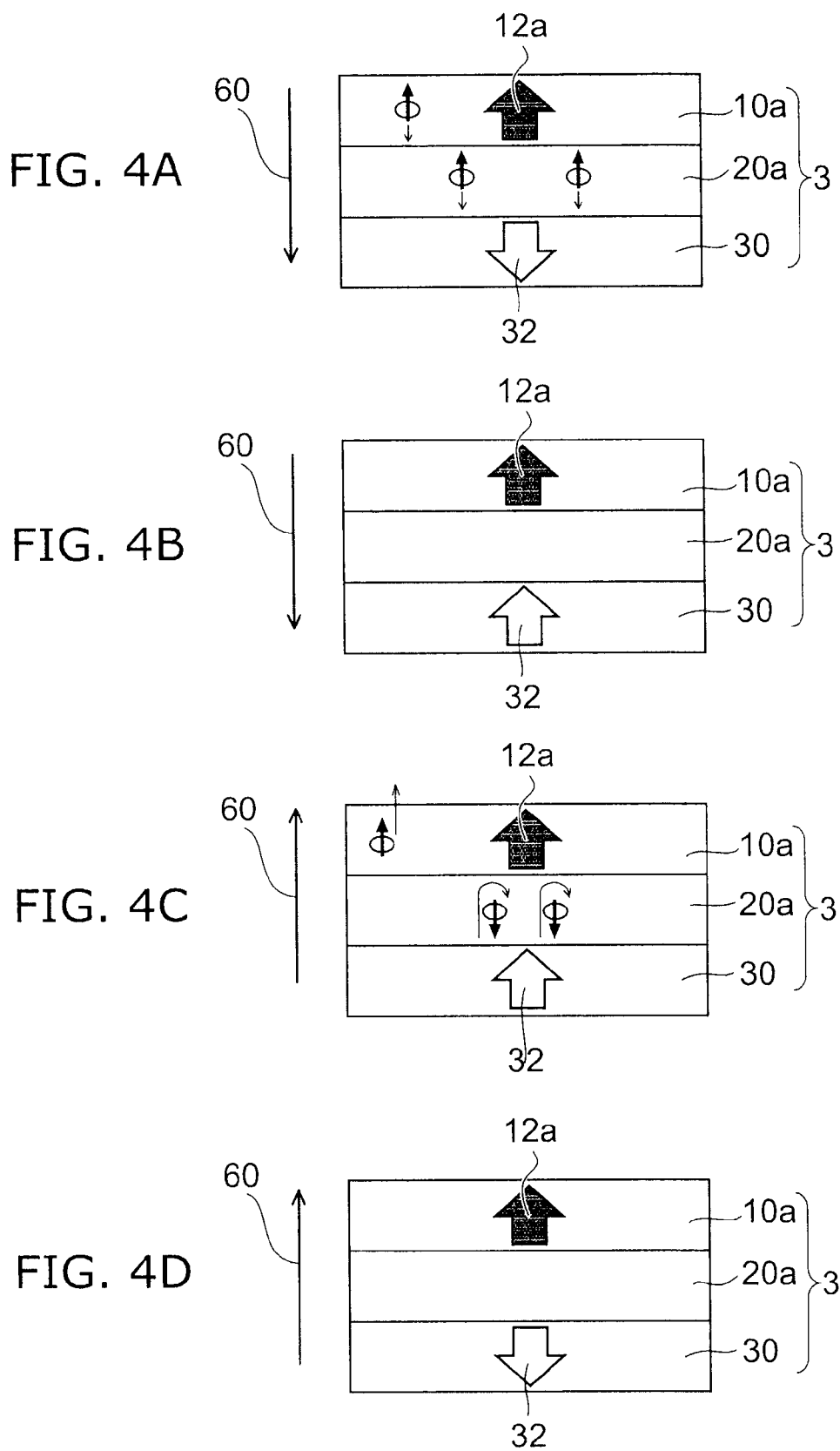

MAGNETIC RECORDING ELEMENT AND NONVOLATILE MEMORY DEVICE

CROSS-REFERENCE TO RELATED APPLICATIONS

This application is based upon and claims the benefit of priority from the prior Japanese Patent Application No. 2010-209390, filed on Sep. 17, 2010; the entire contents of which are incorporated herein by reference.

FIELD

Embodiments described herein relate generally to a magnetic recording element and a nonvolatile memory device.

BACKGROUND

Magnetic random access memory (MRAM) in which a magnetic tunnel junction (MTJ) element exhibiting the tunneling magneto resistive (TMR) effect is used for a data memory unit is drawing attention as a high-speed and large-capacity nonvolatile memory. Writing to the recording layer of the MTJ element is performed by, for example, a spin-transfer torque writing system that passes a current directly through the MTJ element and uses a spin-transfer torque injected from the reference layer of the MTJ element to reverse the magnetization of the recording layer. Here, to achieve a large capacity of memory, it is necessary to downsize the MTJ element to arrange data memory units in high density and to reduce the current necessary for writing.

BRIEF DESCRIPTION OF THE DRAWINGS

FIG. 4A to FIG. 4D are schematic cross-sectional views illustrating the "write" operation in a magnetic recording element;

DETAILED DESCRIPTION

Figures 1A, 1B:
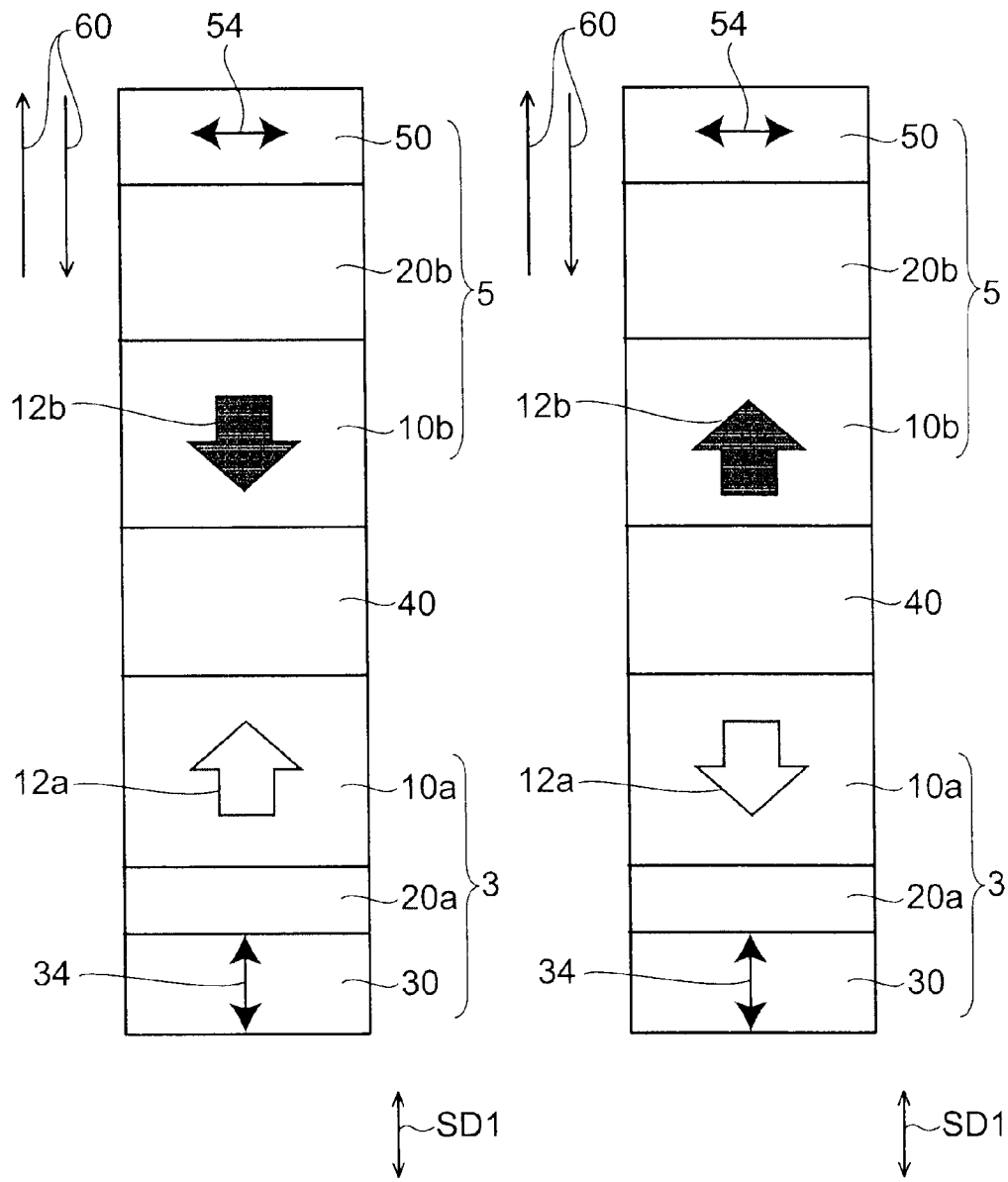
FIGS. 1A and 1B are schematic cross-sectional views showing a magnetic recording element according to a first embodiment.

In general, according to one embodiment, a magnetic recording element includes a stacked body including a first stacked unit and a second stacked unit. The first stacked unit includes a first ferromagnetic layer, a second ferromagnetic layer and a first nonmagnetic layer. Magnetization of the first ferromagnetic layer is substantially fixed in a first direction being perpendicular to a first ferromagnetic layer surface. A direction of magnetization of the second ferromagnetic layer is variable in directions perpendicular to a second ferromagnetic layer surface. The first nonmagnetic layer is provided between the first ferromagnetic layer and the second ferromagnetic layer. The second stacked unit includes a third ferromagnetic layer, a fourth ferromagnetic layer and a second nonmagnetic layer. A direction of magnetization of the third ferromagnetic layer is variable in directions parallel to a third ferromagnetic layer surface. Magnetization of the fourth ferromagnetic layer is substantially fixed in a second direction being perpendicular to a fourth ferromagnetic layer surface. The second nonmagnetic layer is provided between the third ferromagnetic layer and the fourth ferromagnetic layer. The first direction is opposite to the second direction. An electron whose spin is polarized by passing a current in a direction substantially perpendicular to a film surface of each layer of the stacked body acts on the second ferromagnetic layer and a magnetic field generated from a precession of a magnetization of the third ferromagnetic layer acts on the second ferromagnetic layer to enable a direction of magnetization of the second ferromagnetic layer to be determined to a direction in accordance with a direction of the current.

Various embodiments will be described hereinafter with reference to the accompanying drawings.

The drawings are schematic or conceptual; and the relationships between the thickness and width of portions, the proportional coefficients of sizes among portions, etc., are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

FIG. 1A and FIG. 1B are schematic cross-sectional views showing a magnetic recording element according to a first embodiment.

Figure 2A:
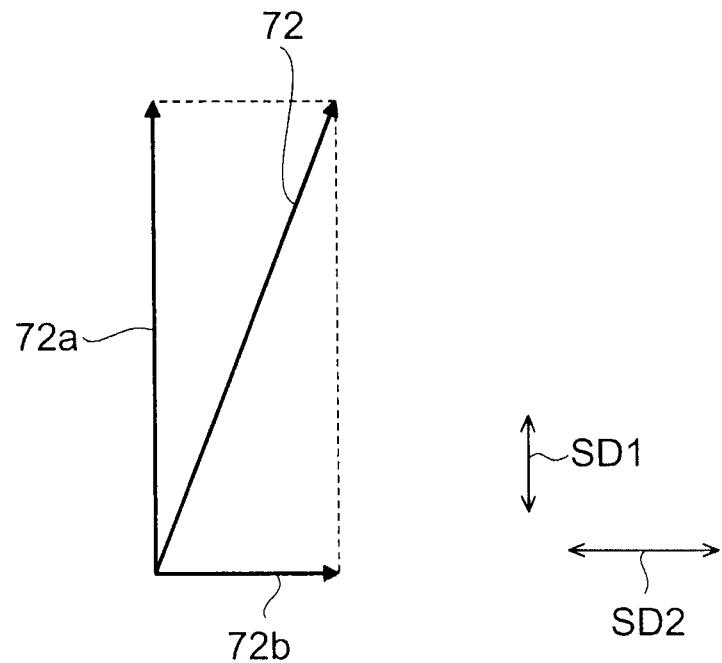
FIG. 2A and FIG. 2B are schematic conceptual views describing magnetization direction.
Figure 2B:
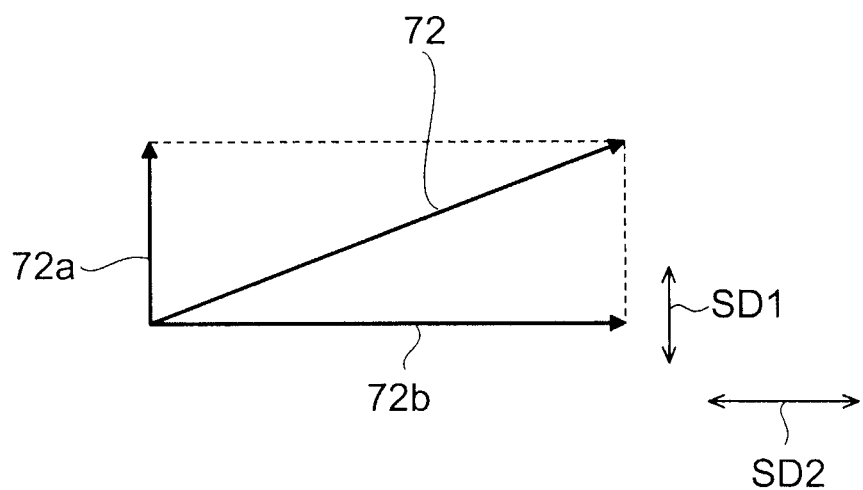

FIG. 2A and FIG. 2B are schematic conceptual views describing magnetization direction.

Figures 3A, 3B:
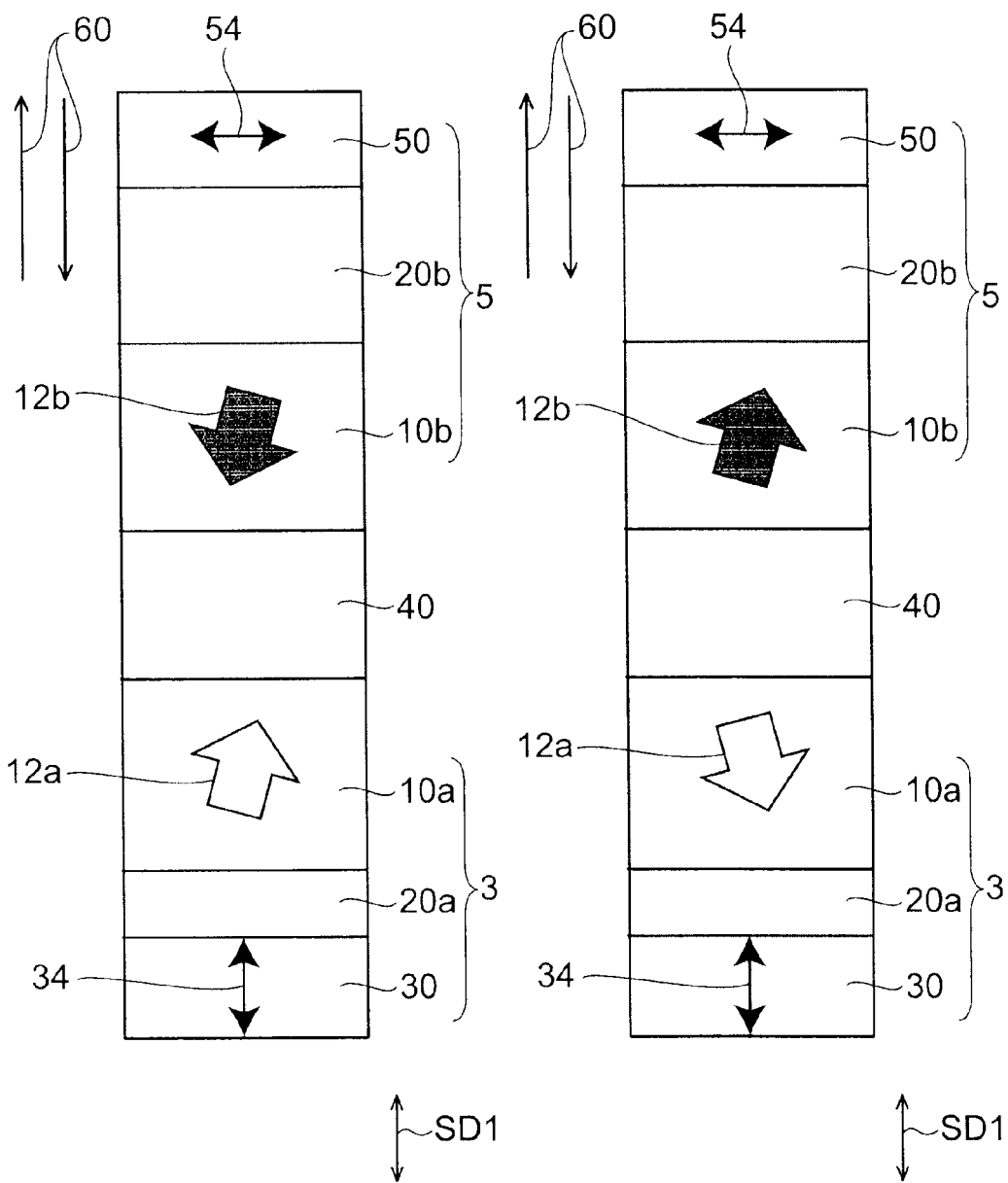
FIG. 3A and FIG. 3B are schematic cross-sectional views showing another magnetic recording element according to the first embodiment.

FIG. 3A and FIG. 3B are schematic cross-sectional views showing another magnetic recording element according to the first embodiment.

The magnetic recording element according to the embodiment includes a magnetic recording unit 3 (first stacked unit) and a magnetic field generation source 5 (second stacked unit).

The magnetic recording unit 3 and the magnetic field generation source 5 are provided via a third nonmagnetic layer 40.

The magnetic recording unit 3 includes a first ferromagnetic layer (first magnetization fixed layer) 10a in which the magnetization 12a is fixed in a direction substantially perpendicular to the film surface, a second ferromagnetic layer (magnetic recording layer) 30 in which the magnetization easy axis 34 is in a direction substantially perpendicular to the film surface, and a first nonmagnetic layer (first spacer layer) 20a provided between the first ferromagnetic layer 10a and the second ferromagnetic layer 30. Here, the direction in which the first ferromagnetic layer 10a, the first nonmagnetic layer 20a, and the second ferromagnetic layer 30 are stacked is referred to as a stacking direction SD1. The stacking direction SD1 is, for example, a direction perpendicular to the film surface of the first ferromagnetic layer 10a.

A stacked structure including the first ferromagnetic layer 10a, the first nonmagnetic layer 20a, and the second ferromagnetic layer 30 is called MTJ (magnetic tunnel junction) and the like.

In the specification of this application, "stack" includes not only the case where a plurality of layers are stacked in contact with each other but also the case where a plurality of layers are stacked via other layers.

The magnetic field generation source 5 is stacked with the magnetic recording unit 3. That is, the magnetic field generation source 5 is stacked with the magnetic recording unit 3 along the stacking direction SD1.

The magnetic field generation source 5 includes a third ferromagnetic layer (magnetization rotation layer) 50 in which the magnetization easy axis 54 is in a direction substantially parallel to the film surface, a fourth ferromagnetic layer (second magnetization fixed layer) 10b in which the magnetization 12b is fixed in a direction substantially perpendicular to the film surface, and a second nonmagnetic layer (second spacer layer) 20b provided between the third ferromagnetic layer 50 and the fourth ferromagnetic layer 10b. The third ferromagnetic layer 50, the second nonmagnetic layer 20b, and the fourth ferromagnetic layer 10b are stacked along the stacking direction SD1.

A perpendicular magnetic film, for example, is used as the first ferromagnetic layer 10a, the second ferromagnetic layer 30, and the fourth ferromagnetic layer 10b.

As shown in FIG. 2A, the perpendicular magnetic film has a magnetization state in which a magnetization oblique shadow component 72a of the magnetization 72 in a direction perpendicular to the film surface (the stacking direction SD1) is larger than a magnetization oblique shadow component 72b of the magnetization 72 in a direction parallel to the film surface (a film surface direction SD2). The direction of the magnetization 72 of the perpendicular magnetic film is preferably substantially perpendicular to the film surface in view of operating characteristics.

On the other hand, an in-plane magnetic film, for example, is used as the third ferromagnetic layer 50.

As shown in FIG. 2B, the in-plane magnetic film has a magnetization state in which the magnetization oblique shadow component 72b of the magnetization 72 in the direction parallel to the film surface (the film surface direction SD2) is larger than the magnetization oblique shadow component 72a of the magnetization 72 in the direction perpendicular to the film surface (the stacking direction SD1). The direction of the magnetization 72 of the in-plane magnetic film is preferably substantially parallel to the film surface in view of operating characteristics.

Here, for convenience of description, the direction from the magnetic recording unit 3 toward the magnetic field generation source 5 is referred to as "upward" or an "upward direction," and the direction from the magnetic field generation source 5 toward the magnetic recording unit 3 is referred to as "downward" or a "downward direction."

The magnetization 12a of the first ferromagnetic layer 10a is substantially fixed in a first direction. The first direction is the upward direction in the magnetic recording element shown in FIG. 1A and the downward direction in the magnetic recording element shown in FIG. 1B. On the other hand, the magnetization 12b of the fourth ferromagnetic layer 10b is substantially fixed in a second direction. The second direction is the downward direction in the magnetic recording element shown in FIG. 1A and the upward direction in the magnetic recording element shown in FIG. 1B.

The magnetic recording element according to the embodiment has a structure in which the second ferromagnetic layer 30, the first nonmagnetic layer 20a, the first ferromagnetic layer 10a, the third nonmagnetic layer 40, the fourth ferromagnetic layer 10b, the second nonmagnetic layer 20b, and the third ferromagnetic layer 50 are stacked in this order. An electronic current 60 can be passed through the magnetic recording element according to the embodiment with not-shown electrodes connected to the second and third ferromagnetic layers 30 and 50, respectively. The electronic current expresses the flow of electrons and flows downward when the current flows upward. The second ferromagnetic layer 30 takes the role of recording data. The magnetization 32 (see FIGS. 4A to 4D and FIGS. 5A and 5B) of the second ferromagnetic layer 30 can be reversed comparatively easily. The third ferromagnetic layer 50 takes the role of generating a high frequency magnetic field during writing.

When the electronic current 60 is passed in the direction perpendicular to the film surface, the magnetization in the third ferromagnetic layer 50 of the magnetic field generation source 5 precesses to generate a rotating magnetic field (high frequency magnetic field). The frequency of the high frequency magnetic field is, for example, about 1 to 60 GHz. The high frequency magnetic field has a component in a direction perpendicular to the magnetization 32 of the second ferromagnetic layer 30, that is, the direction of the magnetization hard axis of the second ferromagnetic layer 30. Therefore, at least part of the high frequency magnetic field generated from the third ferromagnetic layer 50 is applied in the direction of the magnetization hard axis of the second ferromagnetic layer 30. If the high frequency magnetic field generated from the third ferromagnetic layer 50 is applied in the direction of the magnetization hard axis of the second ferromagnetic layer 30, it becomes very easy for the magnetization 32 of the second ferromagnetic layer 30 to reverse.

Here, in the magnetic recording element according to the embodiment, as illustrated in FIG. 1A and FIG. 1B, the direction of the perpendicular oblique shadow component of the magnetization 12a fixed in the first direction and the direction of the perpendicular oblique shadow component of the magnetization 12b fixed in the second direction are opposite to each other.

Furthermore, as shown in FIG. 3A and FIG. 3B, even if the directions of the magnetization 12a of the first ferromagnetic layer 10a and the magnetization 12b of the fourth ferromagnetic layer 10b are oblique to the film surface, it is sufficient that the direction of the perpendicular oblique shadow component of the magnetization 12a fixed in the first direction and the direction of the perpendicular oblique shadow component of the magnetization 12b fixed in the second direction are opposite to each other. This is also applied to the examples described later in regard to FIG. 6A to FIG. 8B.

Consequently, the stray magnetic field applied in the direction perpendicular to the film surface in the position of the second ferromagnetic layer 30 can be reduced or cancelled. On the other hand, the stray magnetic field applied in the direction perpendicular to the film surface in the position of the third ferromagnetic layer 50 can be caused to remain and act.

Thereby, the direction of the rotating magnetic field generated from the third ferromagnetic layer 50 and the direction in which the magnetization of the second ferromagnetic layer 30 precesses agree. Therefore, the rotating magnetic field generated in the third ferromagnetic layer 50 of the magnetic field generation source 5 can assist the magnetization reversal of the second ferromagnetic layer 30 of the magnetic recording unit 3 efficiently. As a result, the current necessary for recording (writing) information to the second ferromagnetic layer 30 can be reduced.

In the embodiment, the first ferromagnetic layer 10a and the fourth ferromagnetic layer 10b may be coupled antiferromagnetically via the third nonmagnetic layer 40. A structure like this in which mutual magnetization directions are coupled antiferromagnetically via a nonmagnetic layer to become antiparallel, that is, the stacked structure of "a first magnetic layer (in the embodiment, the first ferromagnetic layer 10a)/a nonmagnetic layer (in the embodiment, the third nonmagnetic layer 40)/a second magnetic layer (in the embodiment, the fourth ferromagnetic layer 10b)" is called a synthetic anti-ferromagnet (SAF) structure.

Using the SAF structure can enhance the mutual magnetization fixing strength and increase resistance to external magnetic fields and thermal stability. Furthermore, in the structure, the stray magnetic field applied in the direction perpendicular to the film surface in the position of the magnetic recording layer (in the embodiment, the second ferromagnetic layer 30) can be made almost zero.

A metal material such as ruthenium (Ru), iridium (Ir), and osmium (Os) is used as the nonmagnetic layer (intermediate layer) of the SAF structure. The layer thickness of the nonmagnetic layer is set not more than 3 nm (nanometers). This is to obtain a sufficiently strong antiferromagnetic coupling via the nonmagnetic layer.

In the magnetic recording element of the embodiment, the direction of the magnetization of the second ferromagnetic layer 30 can be controlled by passing the electronic current 60 between the first and fourth ferromagnetic layers 10a and 10b placed in the upper and lower positions. Specifically, the direction of the magnetization of the second ferromagnetic layer 30 can be reversed by changing the direction of the flow of the electronic current 60 (polarity). When information is recorded, "0" and "1" may be allotted in accordance with the direction of the magnetization of the second ferromagnetic layer 30.

Here, the "write" operation in the magnetic recording element will now be described.

FIG. 4A to FIG. 4D are schematic cross-sectional views illustrating the "write" operation in the magnetic recording element.

FIG. 4A is a schematic cross-sectional view showing a state where the electronic current 60 has started to be passed from the first ferromagnetic layer 10a toward the second ferromagnetic layer 30. FIG. 4B is a schematic cross-sectional view showing a state where passing the electronic current 60 from the first ferromagnetic layer 10a toward the second ferromagnetic layer 30 has been completed (a state where the magnetization 32 is reversed). FIG. 4C is a schematic cross-sectional view showing a state where the electronic current 60 has started to be passed from the second ferromagnetic layer 30 toward the first ferromagnetic layer 10a. FIG. 4D is a schematic cross-sectional view showing a state where passing the electronic current 60 from the second ferromagnetic layer 30 toward the first ferromagnetic layer 10a has been completed (a state where the magnetization 32 is reversed). For convenience of description, the magnetic field generation source 5 and the third nonmagnetic layer 40 in the magnetic recording element shown in FIGS. 1A and 1B are omitted.

In the operation of writing to the second ferromagnetic layer 30 in which the electronic current 60 is passed to cross the film surfaces of the first ferromagnetic layer 10a and the second ferromagnetic layer 30, the following is performed. Herein, the case is described where the magnetoresistive effect via the first nonmagnetic layer 20a is a normal type. Here, the magnetoresistive effect of the "normal type" refers to the case where electric resistance is higher when the magnetizations of magnetic layers on both sides of a nonmagnetic layer are antiparallel than when they are parallel. That is, in the case of the normal type, the electric resistance between the first ferromagnetic layer 10a and the second ferromagnetic layer 30 via the first nonmagnetic layer 20a is lower when the magnetizations of the first ferromagnetic layer 10a and the second ferromagnetic layer 30 are parallel than when they are antiparallel.

First, in FIG. 4A, an electron having passed through the first ferromagnetic layer 10a having the magnetization 12a in a direction substantially perpendicular to the film surface obtains a spin in the same direction as the magnetization 12a. When the electron flows into the second ferromagnetic layer 30, the angular momentum of the spin is transmitted to the second ferromagnetic layer 30 to act on the magnetization 32. What is called a spin-transfer torque works. Thereby, as shown in FIG. 4B, the second ferromagnetic layer 30 acquires the magnetization 32 in the same direction as the magnetization 12a (the upward direction in the drawing, for example, one direction parallel to the stacking direction SD1). "0", for example, is allotted to the second ferromagnetic layer 30 having the magnetization 32 in this direction (the upward direction in the drawing).

FIG. 4C shows the case where the direction of the electronic current 60 is reversed. In regard to electrons having passed through the first nonmagnetic layer 20a, an electron having a spin in the same direction as the magnetization 12a (the upward direction in the drawing) passes through the first ferromagnetic layer 10a, but an electron having a spin in the opposite direction to the magnetization 12a (the downward direction in the drawing) is reflected at the interface between the first ferromagnetic layer 10a and the first nonmagnetic layer 20a. The angular momentum of the spin of the reflected electron is transmitted to the second ferromagnetic layer 30 to act on the magnetization 32. Thereby, as shown in FIG. 4D, the second ferromagnetic layer 30 acquires the magnetization 32 in the opposite direction to the magnetization 12a (the downward direction in the drawing). What is called a spin-transfer torque works. "1", for example, is allotted to the second ferromagnetic layer 30 having the magnetization 32 in this direction (the downward direction in the drawing).

The action described above allows "0" and "1" to be appropriately allotted to the second ferromagnetic layer 30, completing "writing" in the magnetic recording element. Hereinabove, the case is described where the magnetoresistive effect between the first ferromagnetic layer 10a and the second ferromagnetic layer 30 via the first nonmagnetic layer 20a is the "normal type."

The case where the magnetoresistive effect is a "reverse type" refers to the case where electric resistance is higher when the magnetizations of magnetic layers on both sides of a nonmagnetic layer are parallel than when they are antiparallel. That is, in the case of the reverse type, the electric resistance between the first ferromagnetic layer 10a and the second ferromagnetic layer 30 via the first nonmagnetic layer 20a is higher when the magnetizations of the first ferromagnetic layer 10a and the second ferromagnetic layer 30 are parallel than when they are antiparallel. The "write" operation in the reverse type is similar to the case where the magnetoresistive effect is the "normal type," and a detailed description is therefore omitted.

Next, the "read" operation in the magnetic recording element will now be described.

In the magnetic recording element of the invention, the detection of the direction of the magnetization 32 of the second ferromagnetic layer 30 can be performed by utilizing the "magnetoresistive effect" in which electric resistance changes with the relative direction of the magnetization of each layer. That is, in the case where the magnetoresistive effect is utilized, a sense current 61 may be passed between the first ferromagnetic layer 10a and the second ferromagnetic layer 30 to measure the magnetic resistance. The current value of the sense current 61 is smaller than the current value of the electronic current 60 passed during recording.

Figure 5A:
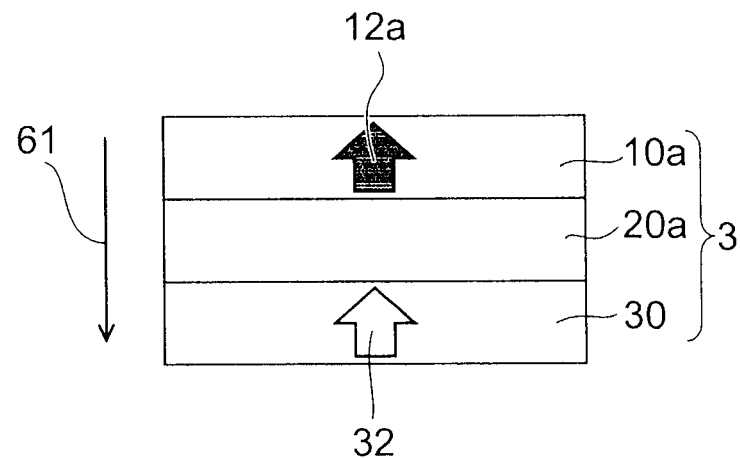
FIG. 5A and FIG. 5B are schematic cross-sectional views illustrating the "read" operation in a magnetic recording element.
Figure 5B:
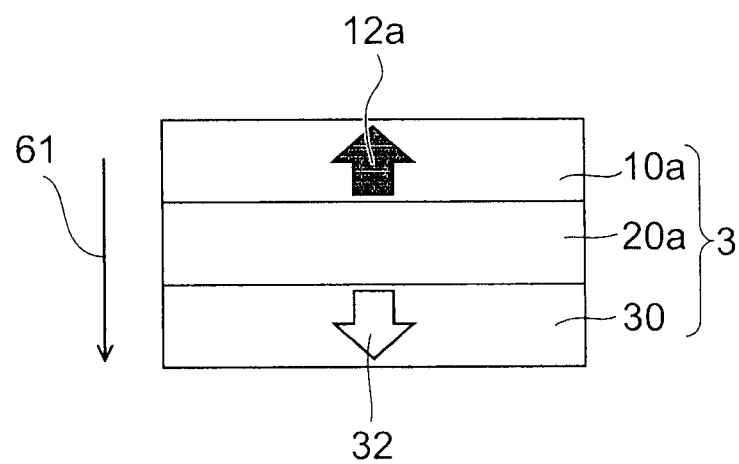

FIG. 5A and FIG. 5B are schematic cross-sectional views illustrating the "read" operation in the magnetic recording element.

FIG. 5A is a schematic cross-sectional view showing the case where the magnetization 12a of the first ferromagnetic layer 10a and the magnetization 32 of the second ferromagnetic layer 30 are in the same direction, and FIG. 5B is a schematic cross-sectional view showing the case where the magnetization 12a of the first ferromagnetic layer 10a and the magnetization 32 of the second ferromagnetic layer 30 are antiparallel. For convenience of description, the magnetic field generation source 5 and the third nonmagnetic layer 40 in the magnetic recording element shown in FIGS. 1A and 1B are omitted.

In the magnetic recording element shown in FIG. 5A, the resistance detected by passing the sense current 61 is a relatively small value under the magnetoresistive effect of the normal type, and a relatively large value under the magnetoresistive effect of the reverse type.

In the magnetic recording element shown in FIG. 5B, the resistance detected by passing the sense current 61 is a relatively large value under the magnetoresistive effect of the normal type, and a relatively small value under the magnetoresistive effect of the reverse type.

By relating "0" and "1" to these states of different resistances, respectively, the record of two value data can be read out. The direction of the sense current 61 may be the direction opposite to the arrow direction shown in FIGS. 5A and 5B (the direction from bottom to top in the drawing).

Next, referring to FIGS. 1A and 1B again, the components of the magnetic recording element of the embodiment will now be described in detail.

As the first and second ferromagnetic layers 10a and 30 of the magnetic recording unit 3, a metal material containing at least one element selected from the group consisting of iron (Fe), cobalt (Co), nickel (Ni), manganese (Mn), and chromium (Cr), for example, is preferably used. In addition, an alloy of the combination of these and at least one element selected from the group consisting of platinum (Pt), palladium (Pd), iridium (Ir), ruthenium (Ru), and rhodium (Rh) may be used. The characteristics of the first and second ferromagnetic layers 10a and 30 can be adjusted by the composition of the magnetic material contained and heat treatment. Furthermore, as the first and second ferromagnetic layers 10a and 30 of the magnetic recording unit 3, an amorphous alloy of rare earth-transition metal such as TbFeCo and GdFeCo may be used. Furthermore, the stacked structure of Co/Pt, Co/Pd, or Co/Ni and the like may be used as the first and second ferromagnetic layers 10a and 30 of the magnetic recording unit 3. Co/Ru, Fe/Au, Ni/Cu, and the like which become perpendicular magnetization depending on the combination with the underlayer can be used by controlling the crystalline orientation direction of the film.

An insulating material as a nonmagnetic tunnel barrier layer may be used as the first nonmagnetic layer 20a of the magnetic recording unit 3. Specifically, for example, an oxide, nitride, or fluoride containing at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used. In addition, for example, as well as $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, and the like, a nonmagnetic semiconductor ($ZnO_x$, InMn, GaN, GaAs, $TiO_x$, Zn, and Te or these materials doped with a transition metal) and the like may be used. The thickness of the first nonmagnetic layer 20a is preferably set to a value in a range approximately from 0.2 nm to 2.0 nm in order to avoid a high resistance while ensuring the uniformity of the insulating film.

As the third ferromagnetic layer 50 of the magnetic field generation source 5, a magnetic metal containing at least one element selected from the group consisting of iron (Fe), cobalt (Co), nickel (Ni), manganese (Mn), and chromium (Cr), for example, may be used. In the case where the third ferromagnetic layer 50 is an in-plane magnetic film, an antiferromagnetic layer may be used as the underlayer to stabilize the direction of the magnetization to the in-plane direction. As the material of the antiferromagnetic layer, Fe—Mn, Pt—Mn, Pt—Cr—Mn, Ni—Mn, Pd—Mn, Pd—Pt—Mn, Ir—Mn, Pt—Ir—Mn, NiO, $Fe_2O_3$, a magnetic semiconductor, and the like may be used.

The second nonmagnetic layer 20b of the magnetic field generation source 5 may be one of a nonmagnetic tunnel barrier layer and a nonmagnetic metal layer.

An insulating material may be used as the nonmagnetic tunnel barrier layer. Specifically, for example, an oxide, nitride, or fluoride containing at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used as the nonmagnetic barrier layer. In addition, as the nonmagnetic barrier layer, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, a nonmagnetic semiconductor ($ZnO_x$, InMn, GaN, GaAs, $TiO_x$, Zn, and Te or these materials doped with a transition metal) and the like may be used. In the case where the tunnel barrier is used as a spacer layer, the thickness thereof is preferably set to a value in a range approximately from 0.2 nm to 2.0 nm.

As the nonmagnetic metal layer, a nonmagnetic metal element selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), bismuth (Bi), and the like or an alloy containing at least two elements selected from the group mentioned above may be used. When the thickness of the second nonmagnetic layer 20b is made not less than 1.5 nm and not more than 20 nm, an interlayer coupling does not occur between magnetic layers and the spin polarization state of a conduction electron is not lost when the conduction electron passes through the nonmagnetic metal layer.

As the fourth ferromagnetic layer 10b of the magnetic field generation source 5, a metal material containing at least one element selected from the group consisting of iron (Fe), cobalt (Co), nickel (Ni), manganese (Mn), and chromium (Cr) is preferably used. Furthermore, an alloy by the combination of these and at least one element selected from the group consisting of platinum (Pt), palladium (Pd), iridium (Ir), ruthenium (Ru), and rhodium (Rh) may be used. The characteristics of the fourth ferromagnetic layer 10b can be adjusted by the composition of the magnetic material contained and heat treatment. In addition, as the fourth ferromagnetic layer 10b, an amorphous alloy of rare earth-transition metal such as TbFeCo and GdFeCo may be used. Furthermore, as the fourth ferromagnetic layer 10b, the stacked structure of Co/Pt, Co/Pd, or Co/Ni and the like may be used. Co/Ru, Fe/Au, Ni/Cu, and the like which become perpendicular magnetization depending on the combination with the underlayer can be used by controlling the crystalline orientation direction of the film.

A nonmagnetic metal layer is used as the third nonmagnetic layer 40 provided between the magnetic recording unit 3 and the magnetic field generation source 5.

As the nonmagnetic metal layer, a nonmagnetic metal element selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), bismuth (Bi), iridium (Ir), osmium (Os), and the like or an alloy containing at least one element selected from the group may be used.

Thus, as the third nonmagnetic layer 40, a material with a long spin diffusion length such as copper (Cu) or a material with a short spin diffusion length such as ruthenium (Ru) may be used. In the case where it is desirable to cancel the effect of mutually spin-polarized electrons being interposed, a material with a short spin diffusion length such as ruthenium (Ru) may be used.

A conductive magnetic material or a nonmagnetic material is used as an electrode provided to pass a current through the magnetic recording element. Specific examples of the conductive magnetic material may include a similar material to the third and fourth ferromagnetic layers 50 and 10b of the magnetic field generation source 5. Specific examples of the nonmagnetic material may include one element selected from the group consisting of gold (Au), copper (Cu), chromium (Cr), zinc (Zn), gallium (Ga), niobium (Nb), molybdenum (Mo), ruthenium (Ru), palladium (Pd), silver (Ag), hafnium (Hf), tantalum (Ta), tungsten (W), platinum (Pt), bismuth (Bi), and aluminum (Al) or an alloy containing at least one selected from the group. As the conductive nonmagnetic material, a material such as carbon nanotube, carbon nanowire, and graphene may be used. As a conductive protection film, an alloy containing at least one element selected from the group consisting of tantalum (Ta), ruthenium (Ru), copper (Cu), gold (Au), silver (Ag), and aluminum (Al) or a material such as graphene may be used. One element selected from the group consisting of copper (Cu) and aluminum (Al) or an alloy containing at least one selected from the group is preferably used from the viewpoint of being resistant to electromigration and low resistive.

The magnetic recording element according to the embodiment may be in a tapered shape or an inverse tapered shape in a vertical cross section (a cross-sectional view cut along a plane perpendicular to the film surface). Alternatively, the shape of the magnetic recording element according to the embodiment may be a circle, ellipse, tetragon, hexagon, or polygon having a plurality of angles in a horizontal cross section (a cross-sectional view cut along a plane parallel to the film surface).

Figures 6A, 6B:
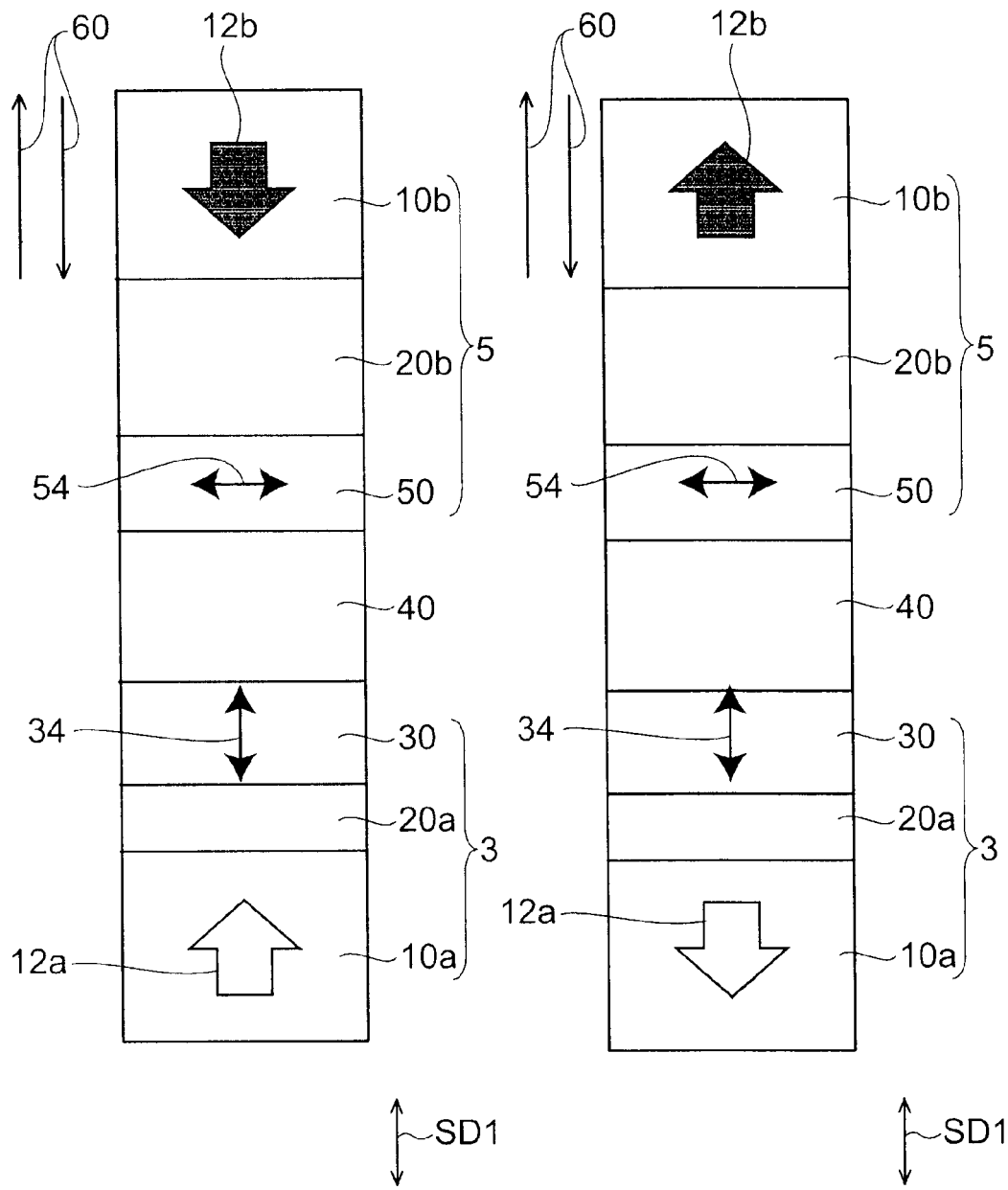
FIG. 6A and FIG. 6B are schematic cross-sectional views showing a magnetic recording element according to a second embodiment.

FIG. 6A and FIG. 6B are schematic cross-sectional views showing a magnetic recording element according to a second embodiment.

The magnetic recording element of the embodiment has a structure in which the first ferromagnetic layer 10a, the first nonmagnetic layer 20a, the second ferromagnetic layer 30, the third nonmagnetic layer 40, the third ferromagnetic layer 50, the second nonmagnetic layer 20b, and the fourth ferromagnetic layer 10b are stacked in this order. The other structures, the material of the components, and the like are similar to those of the magnetic recording element described above in regard to FIGS. 1A and 1B.

In the magnetic recording element according to the embodiment, as shown in FIG. 6A and FIG. 6B, the direction of the perpendicular oblique shadow component of the magnetization 12a fixed in the first direction and the direction of the perpendicular oblique shadow component of the magnetization 12b fixed in the second direction are opposite to each other. Furthermore, the direction of the rotating magnetic field generated from the third ferromagnetic layer 50 and the direction in which the magnetization of the second ferromagnetic layer 30 precesses agree. Furthermore, the distance between the second ferromagnetic layer 30 of the magnetic recording unit 3 and the third ferromagnetic layer 50 of the magnetic field generation source 5 is shorter than that of the magnetic recording element described above in regard to FIGS. 1A and 1B. Consequently, the rotating magnetic field generated in the third ferromagnetic layer 50 of the magnetic field generation source 5 acts more on the second ferromagnetic layer 30 of the magnetic recording unit 3, and can assist the magnetization reversal of the second ferromagnetic layer 30 more efficiently. Thereby, the current necessary for writing to the second ferromagnetic layer 30 can be reduced more.

In addition, in the magnetic recording element according to the embodiment, if the spin information is kept in the third nonmagnetic layer 40, the third ferromagnetic layer 50 is affected by the spin-transfer torque from the second ferromagnetic layer 30. This causes a decrease in the controllability of the magnetization rotation of the third ferromagnetic layer 50. To prevent this, the third nonmagnetic layer 40 is formed by, for example, a layer having a film or structure with a short spin diffusion length such as ruthenium (Ru) (a material having the function of spin cancel).

Thereby, the magnitude of the spin-transfer torque for the magnetization 52 (see FIGS. 18A and 18B and FIGS. 22A and 22B) of the third ferromagnetic layer 50 in the magnetic field generation source 5 to process is determined by the spin polarization in the fourth ferromagnetic layer 10b of the magnetic field generation source 5. Consequently, the magnetization 52 of the third ferromagnetic layer 50 can be controlled independently without being affected by the spin of other electrons (spin-transfer torque).

As the material of the third nonmagnetic layer 40 providing a spin cancel effect like this, a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy containing at lest one element selected from the group can be given. The third nonmagnetic layer 40 preferably has a layer thickness of not less than 1.4 nm so as to prevent an interlayer magnetic coupling between the second ferromagnetic layer 30 and the third ferromagnetic layer 50. If the third nonmagnetic layer 40 has a layer thickness of not less than 1.4 nm, the second ferromagnetic layer 30 and the third ferromagnetic layer 50 are not interlayer-coupled and the third nonmagnetic layer 40 can cancel the degree of spin polarization when conduction electrons pass through the interior and interface of the third nonmagnetic layer 40. Furthermore, the third nonmagnetic layer 40 can prevent the precession of the third ferromagnetic layer 50 from changing due to the direction of the magnetization 32 of the second ferromagnetic layer 30. On the other hand, if the third nonmagnetic layer 40 has a layer thickness of not less than 20 nm, not only the pillar formation of a multiple-layer film is difficult, but also the strength of the rotating magnetic field occurring from the third ferromagnetic layer 50 decreases in the position of the second ferromagnetic layer 30. Therefore, it is not preferable for the third nonmagnetic layer 40 to have a layer thickness of not less than 20 nm.

As the third nonmagnetic layer 40, as well as the single-layer film described above, a stacked film formed by stacking a copper (Cu) layer on one side or both sides of a layer containing a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy containing at least one element selected from the group may be used.

In addition, as the third nonmagnetic layer 40, as well as the single-layer film described above, a stacked film may be used in which an oxide containing at least one element selected from the group consisting of aluminum (Al), magnesium (Mg), titanium (Ti), iron (Fe), cobalt (Co), nickel (Ni), vanadium (V), chromium (Cr), tantalum (Ta), tungsten (W), and ruthenium (Ru) is stacked on one side or both sides of a layer containing a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy containing at least one element selected from the group.

Figures 7A, 7B:
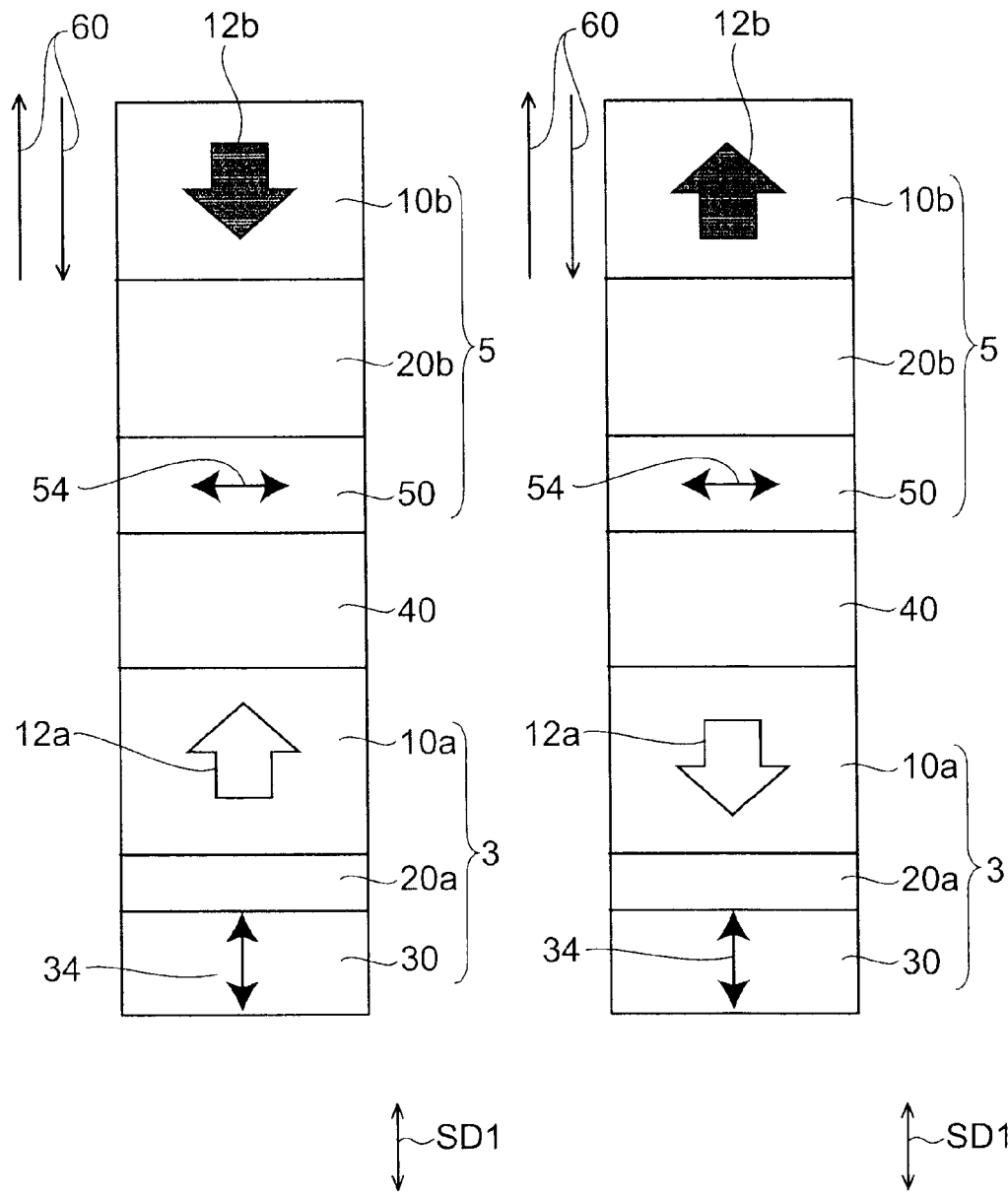
FIG. 7A and FIG. 7B are schematic cross-sectional views showing a magnetic recording element according to a third embodiment.

FIG. 7A and FIG. 7B are schematic cross-sectional views showing a magnetic recording element according to a third embodiment.

The magnetic recording element according to the embodiment has a structure in which the second ferromagnetic layer 30, the first nonmagnetic layer 20a, the first ferromagnetic layer 10a, the third nonmagnetic layer 40, the third ferromagnetic layer 50, the second nonmagnetic layer 20b, and the fourth ferromagnetic layer 10b are stacked in this order. The other structures, the material of the components, and the like are similar to those of the magnetic recording element described above in regard to FIGS. 1A and 1B.

In the magnetic recording element according to the embodiment, as shown in FIG. 7A and FIG. 7B, the direction of the perpendicular oblique shadow component of the magnetization 12a fixed in the first direction and the direction of the perpendicular oblique shadow component of the magnetization 12b fixed in the second direction are opposite to each other. Furthermore, by applying a magnetic field in the direction opposite to the direction of the magnetization 12b of the fourth ferromagnetic layer 10b of the magnetic field generation source 5, the direction of the rotating magnetic field occurring in the third ferromagnetic layer 50 and the direction in which the magnetization of the second ferromagnetic layer 30 precesses can be caused to agree. Furthermore, the distance between the second ferromagnetic layer 30 of the magnetic recording unit 3 and the third ferromagnetic layer 50 of the magnetic field generation source 5 is shorter than that of the magnetic recording element described above in regard to FIGS. 1A and 1B. Therefore, effects similar to the effects described above in regard to FIGS. 6A and 6B are obtained. Thereby, the current necessary for writing to the second ferromagnetic layer 30 can be reduced more.

In the embodiment, the electron injected into the third ferromagnetic layer 50 of the magnetic field generation source 5 has the same direction of spin polarization as the electron spin-polarized in the fourth ferromagnetic layer 10b of the magnetic field generation source 5 and the electron spin-polarized in the first ferromagnetic layer 10a of the magnetic recording unit 3. Consequently, the efficiency of generating the rotating magnetic field occurring in the third ferromagnetic layer 50 increases. As the third nonmagnetic layer 40 and the second nonmagnetic layer 20b of the magnetic field generation source 5, a metal conductor, insulator, or semiconductor may be used. Alternatively, layers based on different materials may be used as the third nonmagnetic layer 40 and the second nonmagnetic layer 20b of the magnetic field generation source 5. However, in the case where an insulator and a semiconductor are used as the third nonmagnetic layer 40, since the resistance value increases, a metal conductor is preferably used as the second nonmagnetic layer 20b of the magnetic field generation source 5. As the metal conductor, copper (Cu), aluminum (Al), silver (Ag), gold (Au), and the like are preferable.

Figures 8A, 8B:
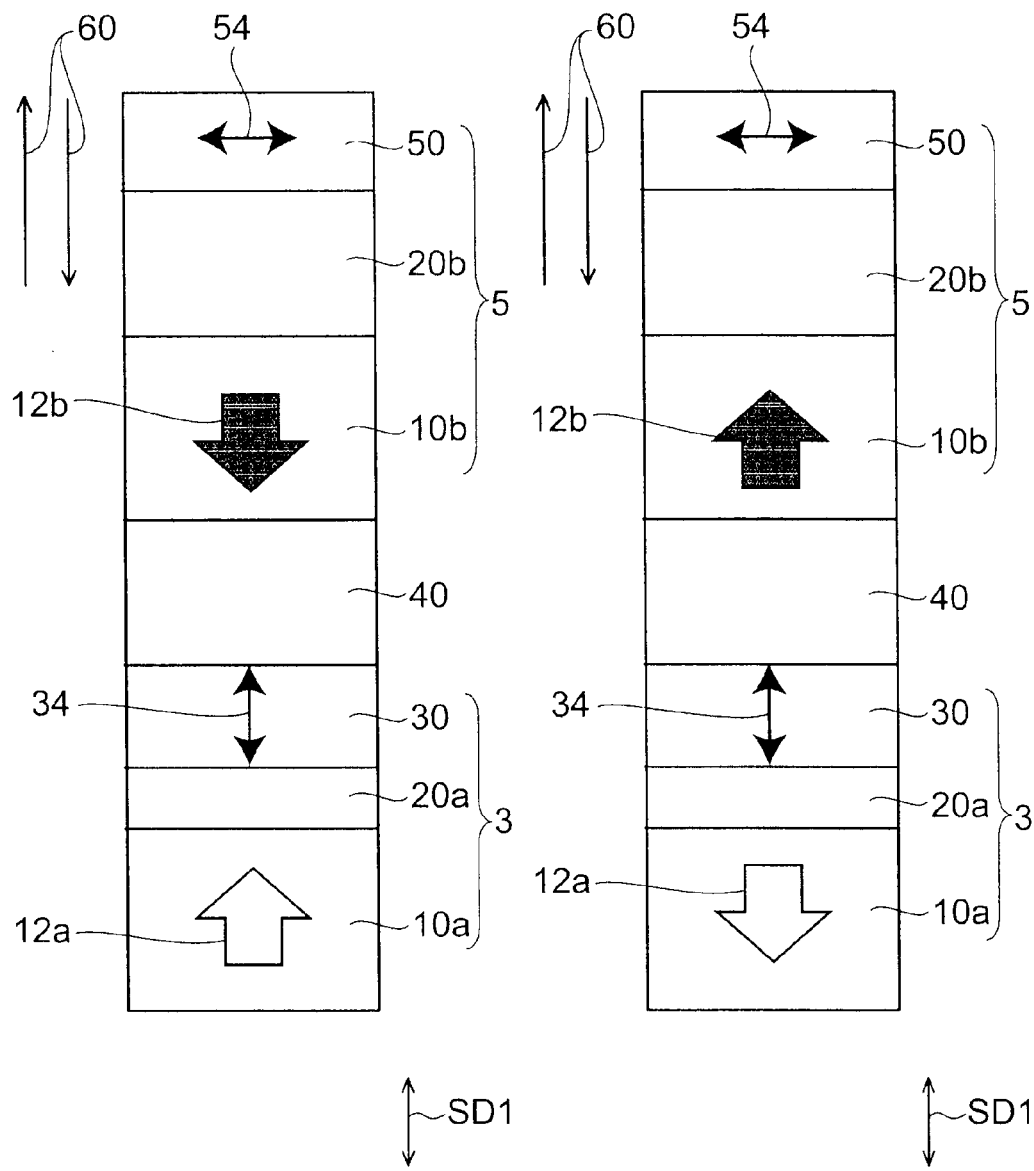
FIG. 8A and FIG. 8B are schematic cross-sectional views showing a magnetic recording element according to a fourth embodiment.

FIG. 8A and FIG. 8B are schematic cross-sectional views showing a magnetic recording element according to a fourth embodiment.

The magnetic recording element according to the embodiment has a structure in which the first ferromagnetic layer 10a, the first nonmagnetic layer 20a, the second ferromagnetic layer 30, the third nonmagnetic layer 40, the fourth ferromagnetic layer 10b, the second nonmagnetic layer 20b, and the third ferromagnetic layer 50 are stacked in this order. The other structures, the material of the components, and the like are similar to those of the magnetic recording element described above in regard to FIGS. 1A and 1B.

In the magnetic recording element according to the embodiment, as shown in FIG. 8A and FIG. 8B, the direction of the perpendicular oblique shadow component of the magnetization 12a fixed in the first direction and the direction of the perpendicular oblique shadow component of the magnetization 12b fixed in the second direction are opposite to each other. Furthermore, by applying a magnetic field in the direction opposite to the direction of the magnetization 12b of the fourth ferromagnetic layer 10b of the magnetic field generation source 5, the direction of the rotating magnetic field occurring in the third ferromagnetic layer 50 and the direction in which the magnetization of the second ferromagnetic layer 30 precesses can be caused to agree. Moreover, the distance between the second ferromagnetic layer 30 of the magnetic recording unit 3 and the third ferromagnetic layer 50 of the magnetic field generation source 5 is shorter than that of the magnetic recording element described above in regard to FIGS. 1A and 1B. Therefore, effects similar to the effects described above in regard to FIGS. 6A and 6B are obtained. Thereby, the current necessary for writing to the second ferromagnetic layer 30 can be reduced more.

In the embodiment, the electron injected into the second ferromagnetic layer 30 of the magnetic recording unit 3 has the same direction of spin polarization as the electron spin-polarized in the fourth ferromagnetic layer 10b of the magnetic field generation source 5 and the electron spin-polarized in the first ferromagnetic layer 10a of the magnetic recording unit 3. Therefore, an efficiency on a magnetization reversal of the second ferromagnetic layer 30 will be improved. As the third nonmagnetic layer 40 and the second nonmagnetic layer 20b of the magnetic field generation source 5, a material similar to the material described above in regard to FIGS. 7A and 7B may be used.

Figure 9:
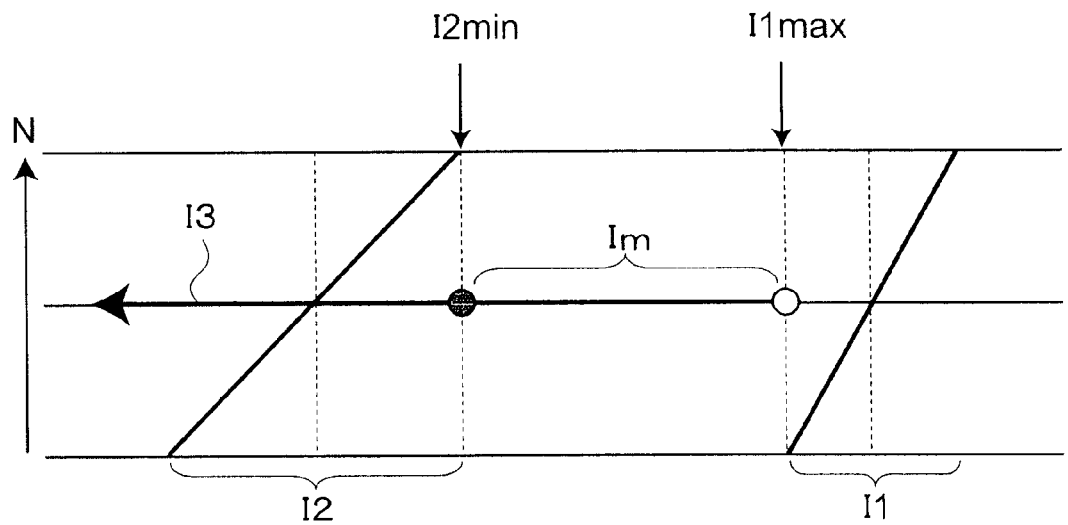
FIG. 9 is a schematic conceptual diagram illustrating a relationship of currents in the first to fourth embodiments.

FIG. 9 is a schematic conceptual diagram illustrating a relationship of currents in the first to fourth embodiments.

The horizontal axis of the schematic conceptual diagram shown in FIG. 9 represents the magnitude of current. The vertical axis of the schematic conceptual diagram shown in FIG. 9 represents the normal probability plot of cumulative relative frequency N.

The switching of the record state ("0" or "1") of the magnetic recording unit 3 is performed using a write current (the electronic current 60) supplied from a not-shown transistor connected to the magnetic recording unit 3. In the switching of the record state of the magnetic recording unit 3, when the direction of the magnetization 32 of the second ferromagnetic layer 30 is switched from the state of being parallel to the direction of the magnetization 12a of the first ferromagnetic layer 10a to the state of being antiparallel, a large current compared to the case of the opposite switching thereto is needed. When a direction in which a large current can be passed through the transistor exists, the direction in which a large current can be passed and the direction in which the second ferromagnetic layer 30 of the magnetic recording unit 3 is switched from the parallel state to the antiparallel state are preferably made in accord.

The reading of the record state of the magnetic recording unit 3 is performed using a read current (the sense current 61) supplied from the transistor. At this time, the current value of the read current is smaller than the current value of the write current, and such a read current as does not change the record state of the second ferromagnetic layer 30 is used. The current values of the read current and the write current may vary with the difference between individual transistors. To fabricate a large capacity memory, the design is carried out in consideration of the difference between individual elements.

FIG. 9 is a schematic conceptual diagram showing a relationship of the ranges of a read current I1 of the magnetic recording unit 3, a write current I2 of the magnetic recording unit 3, and a current I3 by which the third ferromagnetic layer 50 of the magnetic field generation source 5 sustains the precession, in consideration of the difference between individual transistors described above. FIG. 9 shows a situation where the read current I1 and the write current I2 each have a certain range due to the difference between individual transistors.

The maximum value I1max of the read current is set smaller than the minimum value I2min of the write current. The current value at which the third ferromagnetic layer 50 of the magnetic field generation source 5 starts the precession is preferably larger than the maximum value I1max of the read current. In the embodiment, the rotating magnetic field generated in the magnetic field generation source 5 assists the reversal of the magnetization 32 of the second ferromagnetic layer 30 of the magnetic recording unit 3. Therefore, the range of the write current I2 of the magnetic recording unit 3 is preferably within the range of the current I3 by which the magnetic field generation source 5 sustains the precession. In other words, as shown in FIG. 9, the current value at which the third ferromagnetic layer 50 of the magnetic field generation source 5 starts the precession preferably has a margin Im with respect to the minimum value I2min of the write current.

Figure 10:
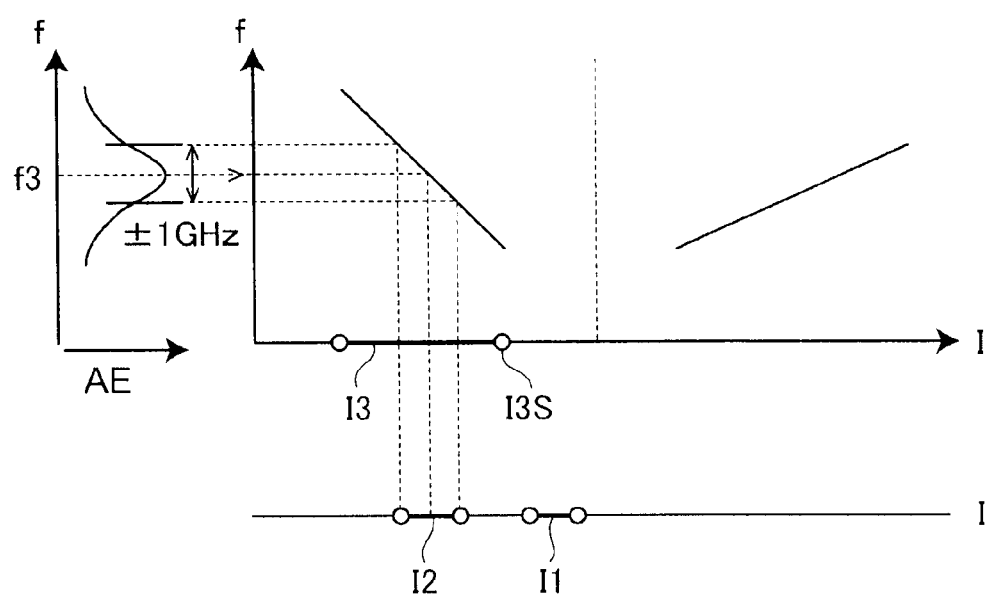
FIG. 10 is a schematic conceptual diagram illustrating a relationship between current and frequency in the first to fourth embodiments.

FIG. 10 is schematic conceptual diagrams illustrating a relationship between current and frequency in the first to fourth embodiments.

The horizontal axis of the left diagram in the schematic conceptual diagrams shown in FIG. 10 represents the magnitude AE by which the assist effect due to resonance is obtained.

In the first to fourth embodiments, a rotating magnetic field near to the resonance frequency f3 of the second ferromagnetic layer 30 of the magnetic recording unit 3 is generated in the magnetic field generation source 5 to assist the reversal of the magnetization 32 of the second ferromagnetic layer 30. To effectively assist the reversal of the magnetization 32 of the second ferromagnetic layer 30, according to the findings of the inventors, the rotating magnetic field occurring in the magnetic field generation source 5 is preferably set approximately within the range or plus or minus one gigahertz of the resonance frequency f3 of the second ferromagnetic layer 30 of the magnetic recording unit 3 (approximately f3±1 GHz (gigahertz)).

In the magnetic field generation source 5, the third ferromagnetic layer 50 starts the precession (oscillation start) by passing a current perpendicular to the film surface. On the other hand, if the current increases and the effect of the spin-transfer torque exceeds the effect of dumping that balances during sustaining the precession, the direction of the magnetization agrees with the direction of the spin-transfer torque (oscillation stop). If the magnitude of the current I (the absolute value of the current amount) increases, the frequency f of the rotating magnetic field generating from the third ferromagnetic layer 50 rises. As a consequence, to assist the reversal of the magnetization 32 of the second ferromagnetic layer 30 by the rotating magnetic field, such a current I3 as generates a rotating magnetic field in the range or plus or minus one gigahertz of the resonance frequency f3 of the second ferromagnetic layer 30 (f3±1 GHz) is passed through the magnetic field generation source 5. The range of the value of the write current I2 of the magnetic recording unit 3 is included within this range of the current I3.

Considering the range of the write current I2 of the magnetic recording unit 3 derived from the difference between individual transistors, in FIG. 10, the gradient of the graph of the current dependence of the frequency f of the rotating magnetic field occurring in the magnetic field generation source 5 is preferably small. According to the findings of the inventors, the gradient changes with the initial angle of the third ferromagnetic layer 50 of the magnetic field generation source 5 (the inclination angle of the magnetization 52 of the third ferromagnetic layer 50 to the fourth ferromagnetic layer 10b before passing a current). The oscillation start current value I3s can be changed by the material and the initial angle of the third ferromagnetic layer 50 of the magnetic field generation source 5.

Figure 11:
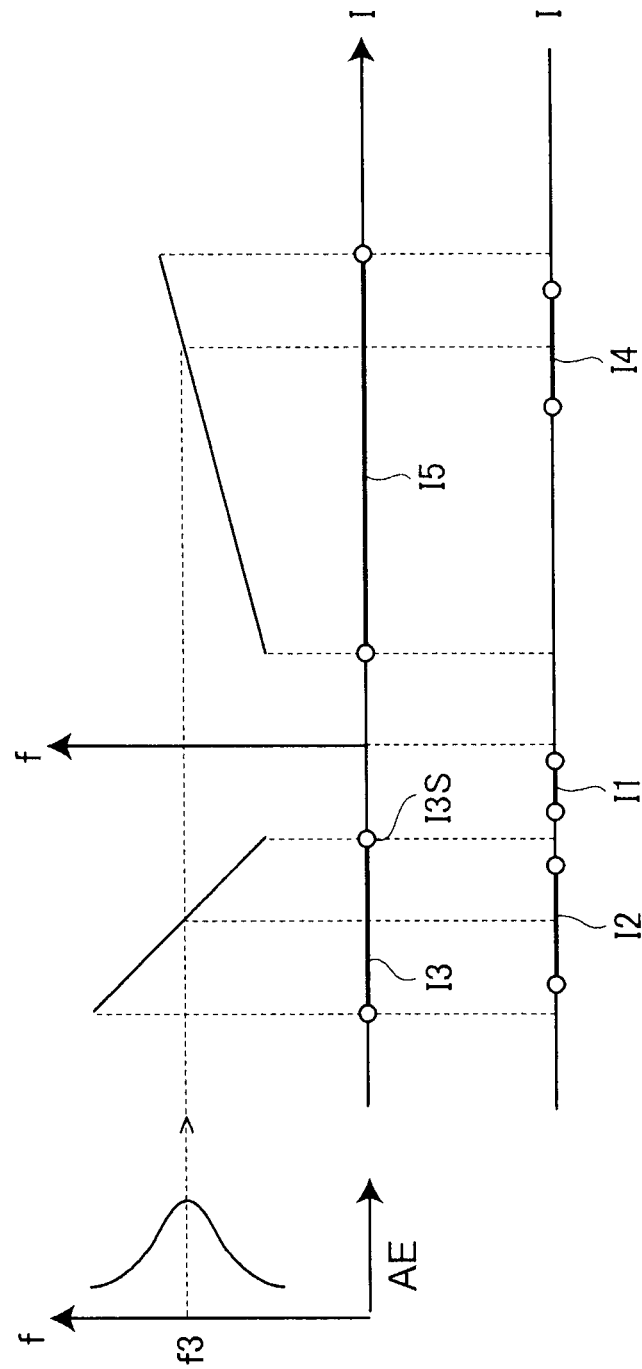
FIG. 11 is a schematic conceptual diagram illustrating another relationship between current and frequency in the first to fourth embodiments.

FIG. 11 is schematic conceptual diagrams illustrating another relationship between current and frequency in the first to fourth embodiments.

The horizontal axis of the left diagram in the schematic conceptual diagrams shown in FIG. 11 represents the magnitude AE by which the assist effect due to resonance is obtained.

As described above in regard to FIG. 10, the current dependence of the frequency f of the rotating magnetic field generated from the magnetic field generation source 5 can be changed by the initial angle of the third ferromagnetic layer 50. The initial angle of the third ferromagnetic layer 50 is determined by the magnitude of the effective magnetic field applied to the third ferromagnetic layer 50. In the first to fourth embodiments, the magnetic field generation source 5 and the magnetic recording unit 3 are stacked, and the direction of the perpendicular oblique shadow component of the magnetization 12a of the first ferromagnetic layer 10a and the direction of the perpendicular oblique shadow component of the magnetization 12b of the fourth ferromagnetic layer 10b are opposite to each other.

Thereby, the stray magnetic field (hereinafter may be referred to as a "shift magnetic field" for convenience of description) applied in the film surface perpendicular direction in the position of the second ferromagnetic layer 30 can be reduced or cancelled. On the other hand, the stray magnetic field from the fourth ferromagnetic layer 10b of the magnetic field generation source 5 and the first ferromagnetic layer 10a and the second ferromagnetic layer 30 of the magnetic recording unit 3 can be caused to act on the third ferromagnetic layer 50 of the magnetic field generation source 5. The oscillation start current value I3s of the rotating magnetic field and the frequency dependence to current are adjusted to a desired range.

FIG. 11 illustrates a relationship between current and frequency assisting both magnetization reversals that change the second ferromagnetic layer 30 of the magnetic recording unit 3 from the parallel state to the antiparallel state and from the antiparallel state to the parallel state. The write current I4 in the case of changing the second ferromagnetic layer 30 from the parallel state to the antiparallel state is larger than the write current I2 in the case of changing it from the antiparallel state to the parallel state. Furthermore, the gradient of the graph of the current dependence of the frequency f of the rotating magnetic field occurring in the magnetic field generation source 5 is smaller in the case where the second ferromagnetic layer 30 is changed from the parallel state to the antiparallel state than in the case where it is changed from the antiparallel state to the parallel state. Therefore, the range of the current I5 by which the third ferromagnetic layer 50 sustains the precession when the second ferromagnetic layer 30 is changed from the parallel state to the antiparallel state is wider than the range of the current I3 by which the third ferromagnetic layer 50 sustains the precession when the second ferromagnetic layer 30 is changed from the antiparallel state to the parallel state. Here, by adjusting the magnitude of the stray magnetic field applied to the third ferromagnetic layer 50 of the magnetic field generation source 5, the rotating magnetic field assisting the reversal of the magnetization 32 can be generated in both write currents.

Figure 12:
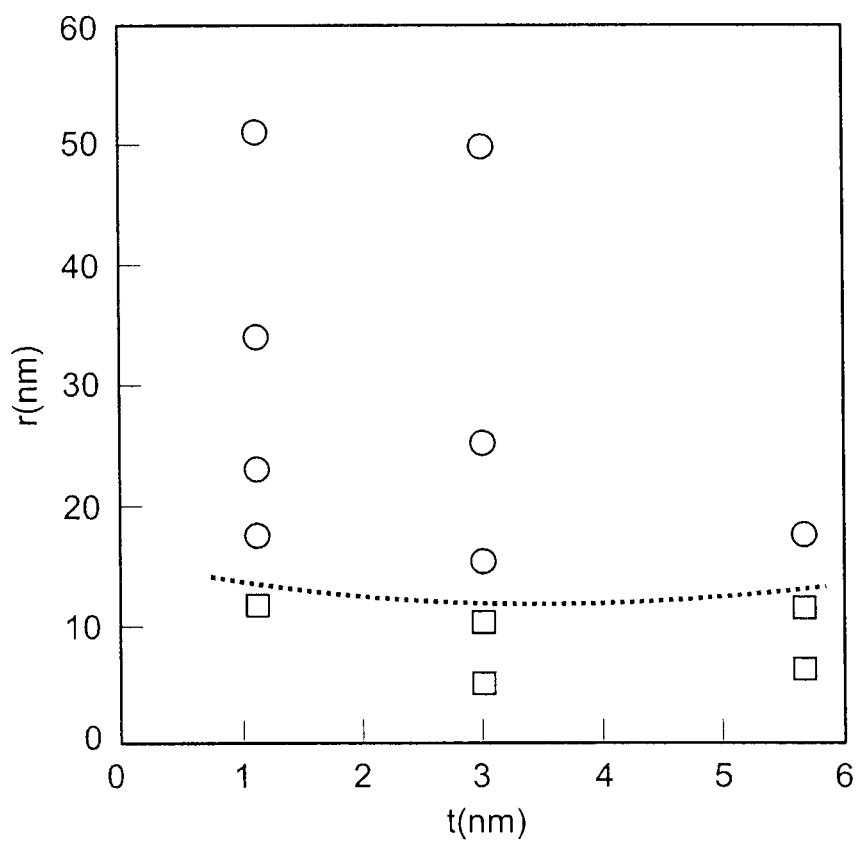
FIG. 12 is a graph illustrating a relationship between the size of the third ferromagnetic layer and the magnetization state during the time when an electronic current flows in the first to fourth embodiments.

FIG. 12 is a graph illustrating a relationship between the size of the third ferromagnetic layer and the magnetization state during the time that an electronic current flows in the first to fourth embodiments.

In the first to fourth embodiments, the size of the third ferromagnetic layer 50 in the magnetic field generation source 5 satisfies the relation of $r<0.419t^2-2.86t+19.8$, assuming that the circle-equivalent diameter of the horizontal cross-sectional shape of the third ferromagnetic layer 50 is R (nm), a value half of "R" is r (=R/2) (nm), and the layer thickness is t (nm).

In the specification of this application, "circle-equivalent diameter" refers to the diameter of a supposed circle that has an area equal to the area of the planar shape in question. For example, in the case where the horizontal cross-sectional shape of the third ferromagnetic layer 50 is a circle, "R" means the diameter. In the case where the horizontal cross-sectional shape of the third ferromagnetic layer 50 is an ellipse, "R" means the diameter of a circle having an area equal to the area of the ellipse. In the case where the horizontal cross-sectional shape of the third ferromagnetic layer 50 is a polygon, "R" means the diameter of a circle having an area equal to the area of the polygon. The horizontal cross-sectional shape of the third ferromagnetic layer 50 is preferably a circle with a diameter of R. The inventors have found out that, when a current of about $10^6$ A/cm$^2$ is passed in the case where this mathematical relation is satisfied, the magnetization 52 of the third ferromagnetic layer 50 precesses all at once with a component in the surface perpendicular direction and the rotating magnetic field is applied to the second ferromagnetic layer 30 of the magnetic recording unit 3.

The circular legend symbol shown in FIG. 12 represents conditions under which the third ferromagnetic layer 50 forms a closure domain (vortex). On the other hand, the square legend symbol shown in FIG. 12 represents conditions under which the third ferromagnetic layer 50 forms no closure domain. In other words, the region above the dotted line of FIG. 12 represents a region in which, when a current is passed, the third ferromagnetic layer 50 forms a closure domain and the core of the closure domain (a portion in the center of the closure domain in which the magnetization has a perpendicular component) circles on the periphery of the third ferromagnetic layer 50. The third ferromagnetic layer 50 forming the core fits the purpose of applying a magnetic field locally. On the other hand, for the purpose of assisting the reversal of the magnetization 32 of the second ferromagnetic layer 30 of the magnetic recording unit 3, precession that forms no closure domain is preferable.

The inventors performed a fitting with a function having a quadratic term based on the dotted line shown in FIG. 12. The fitting has shown that, when a current is passed through the third ferromagnetic layer 50 in the case where the mathematical relation described above is satisfied, the magnetization 52 of the third ferromagnetic layer 50 precesses all at once with a component in the surface perpendicular direction and the rotating magnetic field is applied to the second ferromagnetic layer 30 of the magnetic recording unit 3.

If the direction of passing a current is changed, the rotation direction of the rotating magnetic field occurring in the third ferromagnetic layer 50 becomes the opposite direction. If the current amount is increased, the frequency of the rotating magnetic field increases in proportion to the increase amount of the current. If the current amount is further increased, the magnetization 52 of the third ferromagnetic layer 50 comes to agree with the direction of the spin-transfer torque. From the viewpoint of causing the precession in the third ferromagnetic layer 50 without impairing element characteristics, the thickness of the third ferromagnetic layer 50 of the magnetic field generation source 5 is preferably within a range from 1 nm to 15 nm (in the case of a stacked film, excluding the thicknesses of nonmagnetic layers). From the viewpoint of obtaining a sufficient magnetic field strength to accelerate the reversal of the magnetization 32 in the position of the second ferromagnetic layer 30, it is preferable that the circle-equivalent diameter of the horizontal cross-sectional shape of the third ferromagnetic layer 50 will be within a range of not more than 35 nm and the layer thickness thereof will be within a range of 2±1.5 nm.

The inventors considered the Landau-Lifshitz-Gilbert equation in view of the spin-transfer torque and have found out a current value (Jc) for the third ferromagnetic layer 50 to precess all at once in the case where $r < 0.419t^2 - 2.86t + 19.8$ holds, assuming that the circle-equivalent diameter of the horizontal cross-sectional shape of the fifth ferromagnetic layer 50 of the magnetic field generation source 5 is R (nm), a value half of "R" is r (=R/2), and the layer thickness is t.

$$J_c = \left(\frac{2e}{\hbar}\right)\left[\frac{M_s \cdot t}{g(\theta)}\right]\left[\frac{H_k}{2} + \alpha(H_{pin} - 4\pi N_z M_z)\right], \quad (1)$$

where $H_{pin}$ is the stray field from the fourth ferromagnetic layer 10b at the center of the free layer and $4\pi N_z M_z$ is a demagnetization field due to the z component of the magnetization in the third ferromagnetic layer 50 and α is the Gilbert damping parameter, Ms is the saturation magnetization and g is the spin-torque efficiency factor from Slonczewski's model. Jc is a function of the angle (θ) between the magnetizations of the third ferromagnetic layer 50 and of the fourth ferromagnetic layer 10b. It corresponds to the thickness of the third ferromagnetic layer 50.

Formula 1 indicates that the oscillation threshold current can be reduced by the stray magnetic field from the first and fourth ferromagnetic layers 10a and 10b. That is, the current amount for generating a magnetic field can be adjusted by the layer thicknesses of the first and fourth ferromagnetic layers 10a and 10b.

Figure 13:
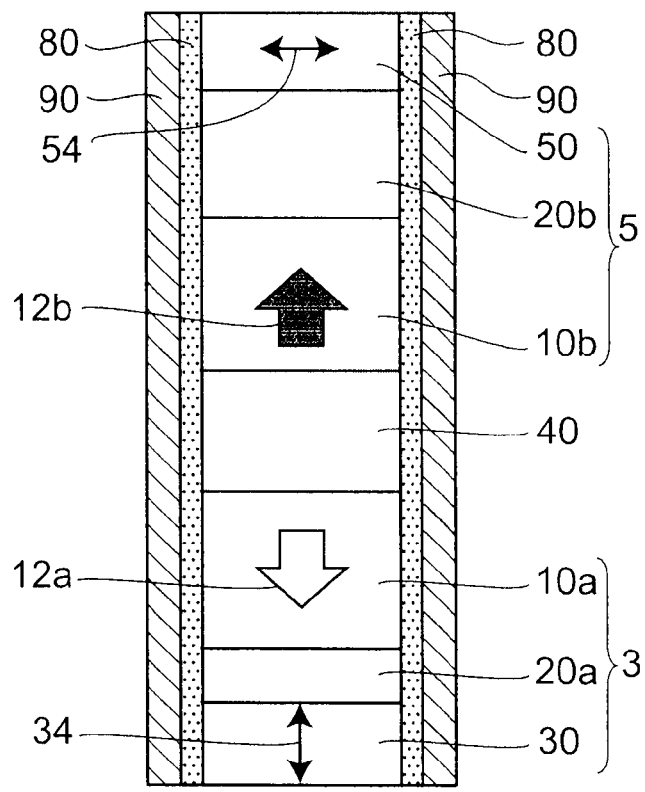
FIG. 13 is a schematic cross-sectional view showing a magnetic recording element according to a fifth embodiment.

FIG. 13 is a schematic cross-sectional view showing a magnetic recording element according to a fifth embodiment.

In the fifth embodiment, as shown in FIG. 13, the magnetic recording unit 3 and the magnetic field generation source 5 are covered with a protection layer 80 and a magnetic shield 90 at the side surface. More specifically, the magnetic recording unit 3 and the magnetic field generation source 5 are covered with the magnetic shield 90 such as permalloy (Py) via the protection layer 80 such as, for example, $SiN_x$ or $Al_2O_3$ at the side surface. The stacking order of the components of each of the magnetic recording unit 3 and the magnetic field generation source 5 is not limited to the stacking order shown in FIG. 13, but may be the stacking order of the examples described above in regard to FIG. 6A to FIG. 8B.

Thereby, the stray magnetic field from an adjacent magnetoresistive effect element can be prevented from affecting the behavior of the magnetic field generation source 5 and the magnetic recording unit 3. Therefore, the current injection amount necessary for generating the rotating magnetic field can be reduced. Furthermore, the stray magnetic field from the magnetic field generation source 5 and the magnetic recording unit 3 can be prevented from acting on an adjacent magnetoresistive effect element. As a consequence, magnetic recording elements can be arranged closely to serve for integration.

Regarding the protection layer 80, an oxide, nitride, or fluoride containing at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used as the nonmagnetic barrier layer.

As the magnetic shield 90, one element selected from the group consisting of iron (Fe), cobalt (Co), nickel (Ni), manganese (Mn), and chromium (Cr) or an alloy by the combination of at least one element selected from the group may be used. In addition, an alloy by the combination of at least one element selected from the group consisting of iron (Fe), cobalt (Co), nickel (Ni), manganese (Mn), and chromium (Cr) and at least one element selected from the group consisting of platinum (Pt), palladium (Pd), iridium (Ir), ruthenium (Ru), and rhodium (Rh) may be used. The characteristics of them can be adjusted by the composition of the magnetic material contained and heat treatment.

Furthermore, the magnetic shield 90 may be composed of an amorphous alloy of rare earth-transition metal such as TbFeCo and GdFeCo, the stacked structure of Co/Pt, Co/Pd, or Co/Ni, or the like.

Next, a method for fabricating a magnetic recording element according to the first to fourth embodiments will now be described.

In the following description, "material A\material B" means that material B is stacked on material A.

First, a lower electrode (not shown) is formed on a wafer, and then the wafer is placed in an ultrahigh vacuum sputter apparatus. Next, on the lower electrode, a Ta\Ru layer (a contact layer with the electrode, also functioning as a stopper layer), an FePd\CoFeB layer (the second ferromagnetic layer 30 of the magnetic recording unit 3), MgO (the first nonmagnetic layer 20a), a CoFeB\FePt layer (the first ferromagnetic layer 10a of the magnetic recording unit 3), Ru (the third nonmagnetic layer 40), an FePt\CoFeB\Cu\Py layer (the magnetic field generation source 5), and a layer of Ta (a contact layer with the electrode) thereon are stacked in this order. Here, the strength of the magnetic anisotropy in the film surface perpendicular direction of the FePd\CoFeB layer and the CoFeB\FePt layer can be adjusted by annealing in a magnetic field as well.

Next, an EB (electron beam) resist is applied to perform EB exposure to form a resist mask with a diameter of 50 nm. Ion milling is performed to remove the portions not covered with the resist until the Ta layer on the lower electrode also functioning as a stopper layer becomes exposed.

Subsequently, a $SiN_x$ layer is formed as the protection layer 80, and then a Py layer functioning as the magnetic shield 90 is formed. Etchback is performed to cause the Py layer to remain at the side wall of the magnetic recording element.

Next, a $SiO_2$ film is film-formed in order to perform the insulative embedding of the magnetic recording element, then planarization is performed by CMP (chemical mechanical polishing) or the like, and then RIE (reactive ion etching) or the like is performed to etch the entire surface to expose the contact layer with the electrode.

Further, a resist is applied on the entire surface, and a stepper exposure apparatus is used to perform patterning on the resist so that a portion not covered with the resist may be created in the portion of the upper electrode. The opening corresponding to the upper electrode is filled with Cu to form a film, and the resist is removed. A not-shown interconnection is provided on the upper electrode to allow electrical input and output.

As described above, according to the first to fifth embodiments, the direction of the perpendicular oblique shadow component of the magnetization 12a of the first ferromagnetic layer 10a fixed in the first direction and the direction of the perpendicular oblique shadow component of the magnetization 12b of the fourth ferromagnetic layer 10b fixed in the second direction are opposite to each other. Thus, the stray magnetic field applied in the direction perpendicular to the film surface in the position of the second ferromagnetic layer 30 can be reduced or cancelled. Furthermore, the direction of the rotating magnetic field occurring in the third ferromagnetic layer 50 and the direction in which the magnetization of the second ferromagnetic layer 30 precesses agree. Therefore, the rotating magnetic field generated in the third ferromagnetic layer 50 of the magnetic field generation source 5 can efficiently assist the magnetization reversal of the second ferromagnetic layer 30 of the magnetic recording unit 3. As a consequence, the current necessary for writing information to the second ferromagnetic layer 30 can be reduced. Thereby, with the aim of providing a large capacity memory, the MTJ element can be downsized to increase the cell occupancy in a chip and contribute significantly to reducing the current necessary for writing.

Next, a specific example of the embodiment will now be described with reference to the drawings.

Figure 14:
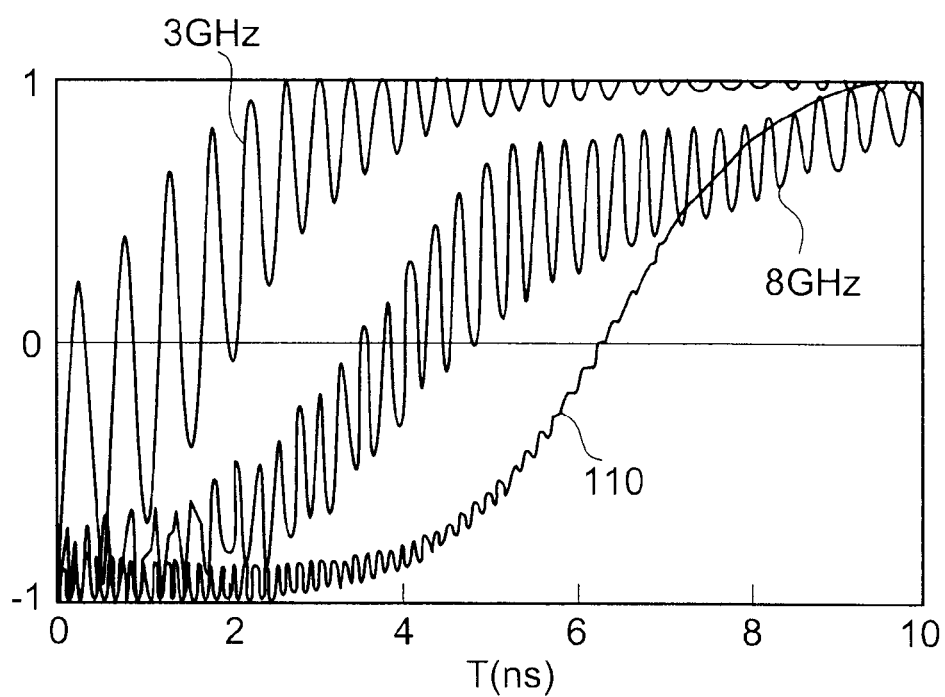
FIG. 14 is a graph illustrating the time of the magnetization reversal in a first specific example.

FIG. 14 is a graph illustrating the time of the magnetization reversal in a first specific example.

FIG. 14 shows an example of the results of simulation using micromagnetics in the system of the magnetic recording element shown in FIG. 1A and FIG. 1B. "−1" of the vertical axis of the graph shown in FIG. 14 indicates that the magnetization 32 of the second ferromagnetic layer 30 is in the antiparallel state to the magnetization 12a of the first ferromagnetic layer 10a. On the other hand, "1" of the vertical axis of the graph shown in FIG. 14 indicates that the magnetization 32 of the second ferromagnetic layer 30 is in the parallel state to the magnetization 12a of the first ferromagnetic layer 10a. In other words, FIG. 14 shows the time T in which the magnetization 32 of the second ferromagnetic layer 30 leads from the antiparallel state to the parallel state to the magnetization 12a of the first ferromagnetic layer 10a. The horizontal axis of the graph shown in FIG. 14 represents the time T (nanoseconds).

The magnetic recording element in the first specific example has a structure in which the magnetic field generation source 5 is stacked above the magnetic recording unit 3 via the third nonmagnetic layer 40. The rotating magnetic field generated by the third ferromagnetic layer 50 of the magnetic field generation source 5 precessing is caused to act on the second ferromagnetic layer 30 of the magnetic recording unit 3 to assist the magnetization reversal. To obtain the assist effect at this time, a film configuration is employed in which the third ferromagnetic layer 50 generates a magnetic field near to the resonance frequency f3 of the second ferromagnetic layer 30.

An example of the conditions of the frequency and strength of the magnetic field by which the reversal of the magnetization 32 of the second ferromagnetic layer 30 of the magnetic recording unit 3 is assisted is as follows. The magnetic recording unit 3 is in a pillar shape with a diameter of 50 nm. The first ferromagnetic layer 10a (layer thickness: 5 nm) is a perpendicular magnetic film of Ms (magnetization)=1000 emu/cc, and Ku (magnetization anisotropy)=8 Merg/cm$^3$.

The first nonmagnetic layer 20a (layer thickness: 1 nm) is made of MgO. The second ferromagnetic layer 30 (layer thickness: 2 nm) is a perpendicular magnetic film of Ms=800 emu/cc, and Ku=3.5 Merg/cm$^3$. The spin polarization degree and the dumping constant are 0.4 and 0.01, respectively. At this time, the resonance frequency of the magnetic recording unit 3 is 3.5 GHz.

In a state where the magnetization 32 of the second ferromagnetic layer 30 of the magnetic recording unit 3 was antiparallel to the magnetization 12a of the first ferromagnetic layer 10a, a current of 48 µA (microamperes) was passed in the direction from the magnetic recording unit 3 toward the magnetic field generation source 5. The time T in which the magnetization 32 of the second ferromagnetic layer 30 leads from being antiparall to parallel to the magnetization 12a of the first ferromagnetic layer 10a when assist magnetic fields (rotating magnetic fields) with different frequencies are applied from the outside is as shown in FIG. 14. When an assist magnetic field of 3 GHz is applied, the time T leading to the magnetization reversal is shortened as compared to the case of no assist magnetic field 110, and the efficiency of magnetization reversal is increased by the assist magnetic field.

Figure 15:
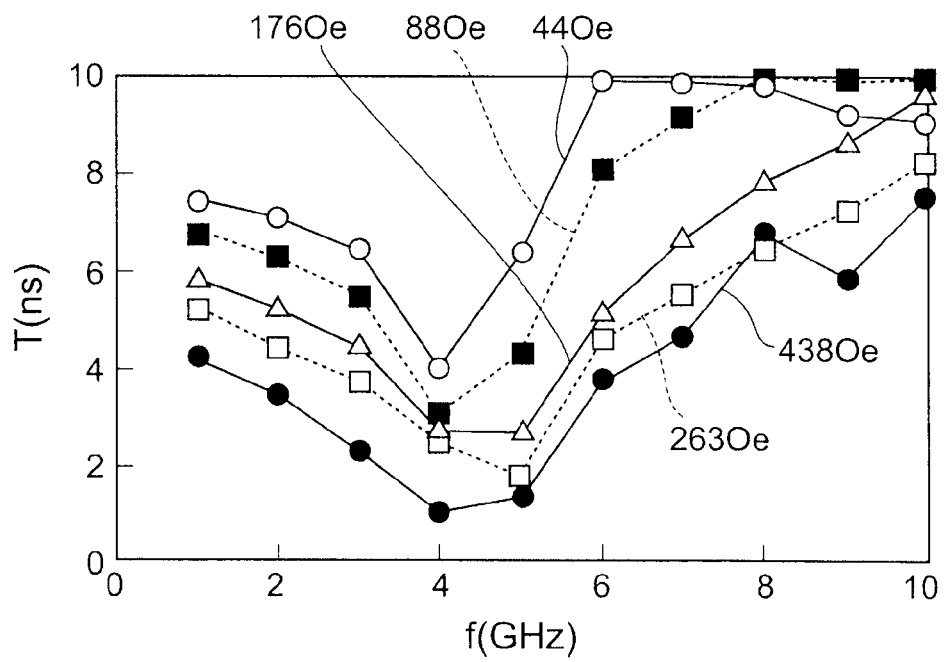
FIG. 15 is a graph illustrating the time of the magnetization reversal to the strength and frequency of the assist magnetic field in the first specific example.

FIG. 15 is a graph illustrating the time of the magnetization reversal to the strength and frequency of the assist magnetic field in the first specific example.

The horizontal axis of the graph shown in FIG. 15 represents the frequency f (GHz) of the assist magnetic field. The vertical axis of the graph shown in FIG. 15 represents the time T (nanoseconds) of the magnetization reversal.

The time T of the magnetization reversal in the case where no assist magnetic field is applied is 8.3 ns (nanoseconds). Applying a magnetic field with a resonance frequency of f3±1 GHz shortens the time T leading to the magnetization reversal. Furthermore, the greater the magnetic field strength is, the shorter the time T leading to the magnetization reversal is.

Figure 16:
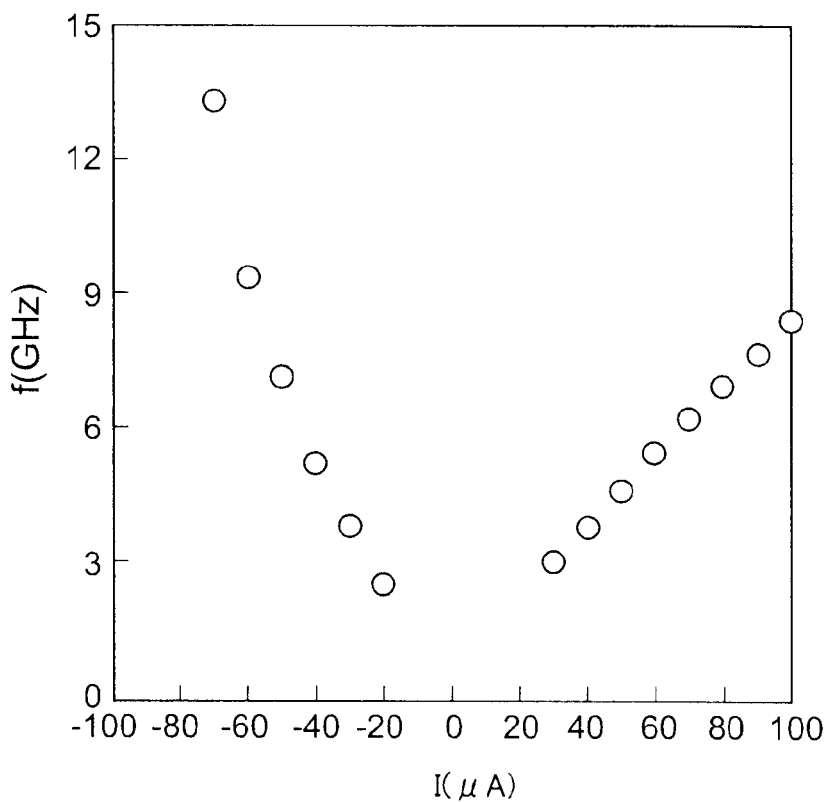
FIG. 16 is a graph illustrating the frequency response of a magnetic field occurring to the exterior to current in the first specific example.

FIG. 16 is a graph illustrating the frequency response of a magnetic field occurring to the exterior to current in the first specific example.

The horizontal axis of the graph shown in FIG. 16 represents current I (µA). The vertical axis of the graph shown in FIG. 16 represents the frequency f (GHz) of the magnetic field occurring to the exterior. In the first specific example, the magnetic field generation source 5 generating the assist magnetic field is stacked above the magnetic recording unit 3 via the third nonmagnetic layer 40. The direction of the perpendicular oblique shadow component of the magnetization 12a of the first ferromagnetic layer 10a and the direction of the perpendicular oblique shadow component of the magnetization 12b of the fourth ferromagnetic layer 10b are opposite to each other.

If a structure is employed in which the stray magnetic field from the first ferromagnetic layer 10a and the fourth ferromagnetic layer 10b is almost zero in the position of the second ferromagnetic layer 30 in the system of the magnetic recording element shown in FIG. 1A and FIG. 1B, the stray magnetic field remains at the film surface in the downward direction in the position of the third ferromagnetic layer 50. In this case, the frequency f of the rotating magnetic field that the magnetic field generation source 5 generates exhibits a response asymmetric to the direction of the current I as shown in FIG. 16.

The conditions of the components in the graph shown in FIG. 16 are as follows. The first ferromagnetic layer 10a (layer thickness: 5 nm) is a perpendicular magnetic film of Ms=1000 emu/cc, and Ku=8 Merg/cm$^3$. The first nonmagnetic layer 20a (layer thickness: 2 nm) is made of copper (Cu).

The third ferromagnetic layer 50 (layer thickness: 3 nm) is an in-plane magnetic film of Ms=800 emu/cc, and Ku=5000 erg/cm$^3$. In the graph shown in FIG. 16, a frequency f asymmetric to the direction of the current I is obtained like the relation between current and frequency shown in FIG. 11. Thereby, the current value necessary in the case of generating a rotating magnetic field with the same frequency f can be made larger in the case where the second ferromagnetic layer 30 leads from being parallel to antiparallel than in the case where it leads from being antiparallel to parallel.

Figure 17:
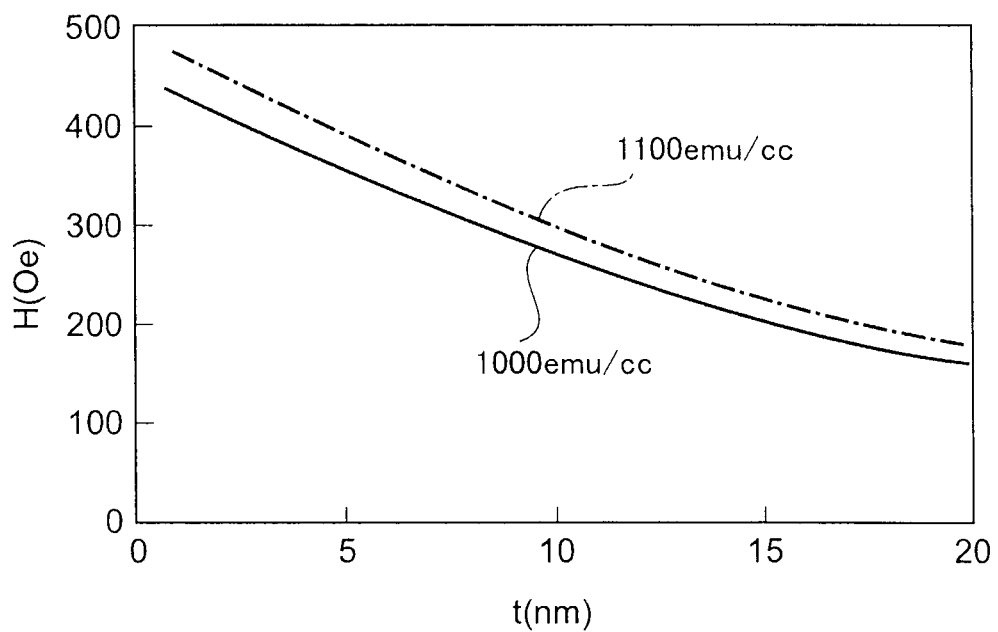
FIG. 17 is a graph illustrating a relationship between the layer thickness of the third nonmagnetic layer and magnetic field strength in the first specific example.

FIG. 17 is a graph illustrating a relationship between the layer thickness of the third nonmagnetic layer and magnetic field strength in the first specific example.

The horizontal axis of the graph shown in FIG. 17 represents the layer thickness t (nm) of the third nonmagnetic layer 40. The vertical axis of the graph shown in FIG. 17 represents the strength H (Oe) of the rotating magnetic field in the position of the second ferromagnetic layer 30. 1100 emu/cc and 1000 emu/cc in FIG. 17 express the Ms of the third ferromagnetic layer 50.

It is sufficient that the layer thickness of the third nonmagnetic layer 40 in order to obtain such a magnetic field strength as provides the assist effect in the position of the second ferromagnetic layer 30 (the center position in the film surface) satisfies such a relation as is shown in FIG. 17.

The magnetic field generation source 5 was actually stacked on the magnetic recording unit 3 as illustrated by the following conditions in the system of the magnetic recording element shown in FIG. 1A and FIG. 1B. The fourth ferromagnetic layer 10b (layer thickness: 5 nm) is a perpendicular magnetic film of Ms=1000 emu/cc, and Ku=8 Merg/cm$^3$. The second nonmagnetic layer 20b (layer thickness: 2 nm) is made of copper (Cu). The third ferromagnetic layer 50 (layer thickness: 3 nm) is an in-plane magnetic film of Ms=800 emu/cc, and Ku=5000 erg/cm$^3$. The third nonmagnetic layer has a layer thickness of 1 nm. The first ferromagnetic layer 10a (layer thickness: 5 nm) is a perpendicular magnetic film of Ms=1000 emu/cc, and Ku=8 Merg/cm$^3$. The first nonmagnetic layer (layer thickness: 1 nm) is made of MgO. The second ferromagnetic layer 30 (layer thickness: 2 nm) is a perpendicular magnetic film of Ms=800 emu/cc, and Ku=3.5 Merg/cm$^3$. When a current of 48 μA was passed in the direction from the magnetic recording unit 3 toward the magnetic field generation source 5, the magnetization reversal occurred in a time of 1.5 ns.

Next, a method for fabricating a magnetic recording element (see FIG. 1A and FIG. 1B) in the first specific example will now be described.

First, a lower electrode (not shown) is formed on a wafer, and then the wafer is placed in an ultrahigh vacuum sputter apparatus. Next, on the lower electrode, a Ta\Ru layer (a contact layer with the electrode, also functioning as a stopper layer), an FePd\CoFeB layer (the second ferromagnetic layer 30 of the magnetic recording unit 3), MgO (the first nonmagnetic layer 20a), a CoFeB\FePt layer (the first ferromagnetic layer 10a of the magnetic recording unit 3), Cu (the third nonmagnetic layer 40), an FePd\CoFeB\Cu\Py layer (the magnetic field generation source 5), and a layer of Ru\Ta (a contact layer with the electrode) thereon are stacked in this order. Here, the strength of the magnetic anisotropy in the film surface perpendicular direction of the FePd\CoFeB layer and the CoFeB\FePt layer can be adjusted by annealing in a magnetic field as well.

Next, an EB (electron beam) resist is applied to perform EB exposure to form a resist mask with a diameter of 50 nm. Ion milling is performed to remove the portions not covered with the resist until the Ta layer on the lower electrode also functioning as a stopper layer becomes exposed. Next, a SiO$_2$ film is film-formed in order to perform the insulative embedding of the magnetic recording element, and then the resist mask is lifted off.

Further, a resist is applied on the entire surface, and a stepper exposure apparatus is used to perform patterning on the resist so that a portion not covered with the resist may be created in the portion of the upper electrode. The opening corresponding to the upper electrode is filled with Cu to form a film, and the resist is removed. A not-shown interconnection is provided on the upper electrode to allow electrical input and output. In the magnetic recording element thus fabricated, there is no effect of the shift magnetic field in the position of the second ferromagnetic layer 30, and the direction of the rotating magnetic field and the direction of the precession of the magnetization 32 of the second ferromagnetic layer 30 agree. Thus, the magnetization reversal occurred with a small current as compared to the case where the magnetic field generation source 5 is not stacked.

Next, another specific example of the embodiment will now be described with reference to the drawings.

Figure 18A:
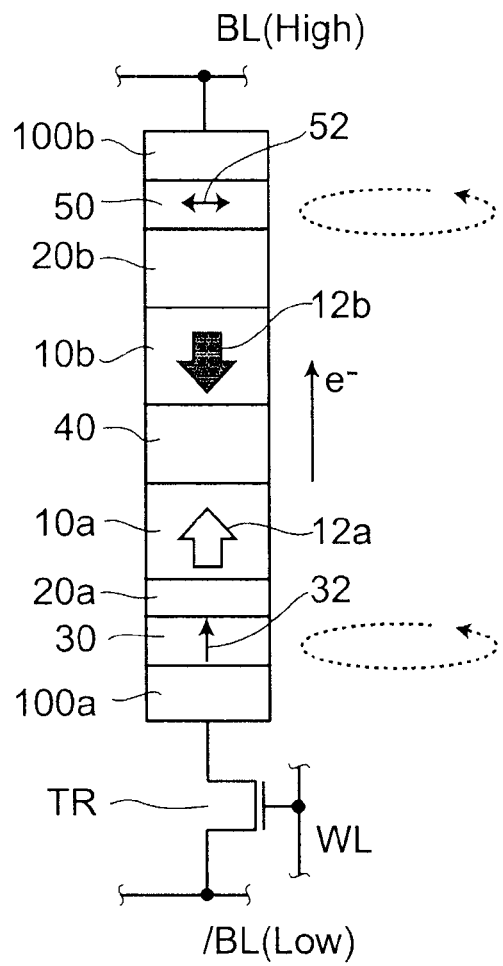
FIG. 18A and FIG. 18B are schematic cross-sectional views showing a magnetic recording element in a second specific example.
Figure 18B:
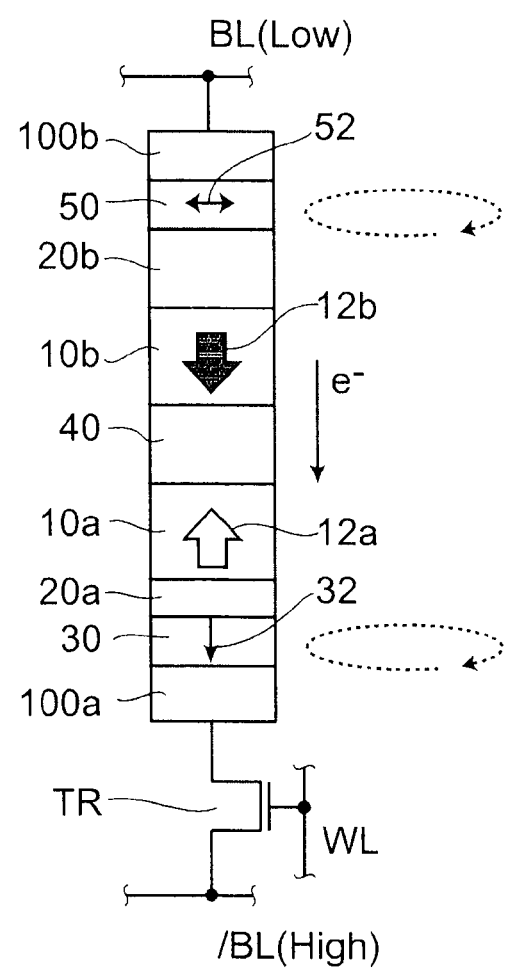

FIG. 18A and FIG. 18B are schematic cross-sectional views showing a magnetic recording element in a second specific example.

FIG. 18A is a schematic cross-sectional view showing the magnetic recording element in the case where electrons e$^-$ flow from a lower electrode 100a toward an upper electrode 100b, and FIG. 18B is a schematic cross-sectional view showing the magnetic recording element in the case where electrons e$^-$ flow from the upper electrode 100b toward the lower electrode 100a.

The stacked structure of the magnetic recording element in the second specific example is similar to the stacked structure of the magnetic recording element shown in FIG. 1A. The lower electrode 100a is provided below the second ferromagnetic layer 30. The upper electrode 100b is provided on the third ferromagnetic layer 50. The upper electrode 100b is connected to a bit line BL (first interconnection). The lower electrode 100a is connected to the drain terminal of a selection transistor TR. The gate terminal of the selection transistor TR is connected to a word line WL (second interconnection). The source terminal of the selection transistor TR is connected to a bit line /BL.

The magnetic recording element in the second specific example satisfies the relation of $r<0.419t^2-2.86t+19.8$, assuming that the circle-equivalent diameter of the horizontal cross-sectional shape of the third ferromagnetic layer 50 is R (nm), a value half of "R" is r (nm), and the layer thickness is t (nm). For example, a magnetic recording element in which the third ferromagnetic layer 50 has a diameter of 20 nm and a layer thickness of 3 nm falls under the magnetic recording element of the specific example.

Figure 19:
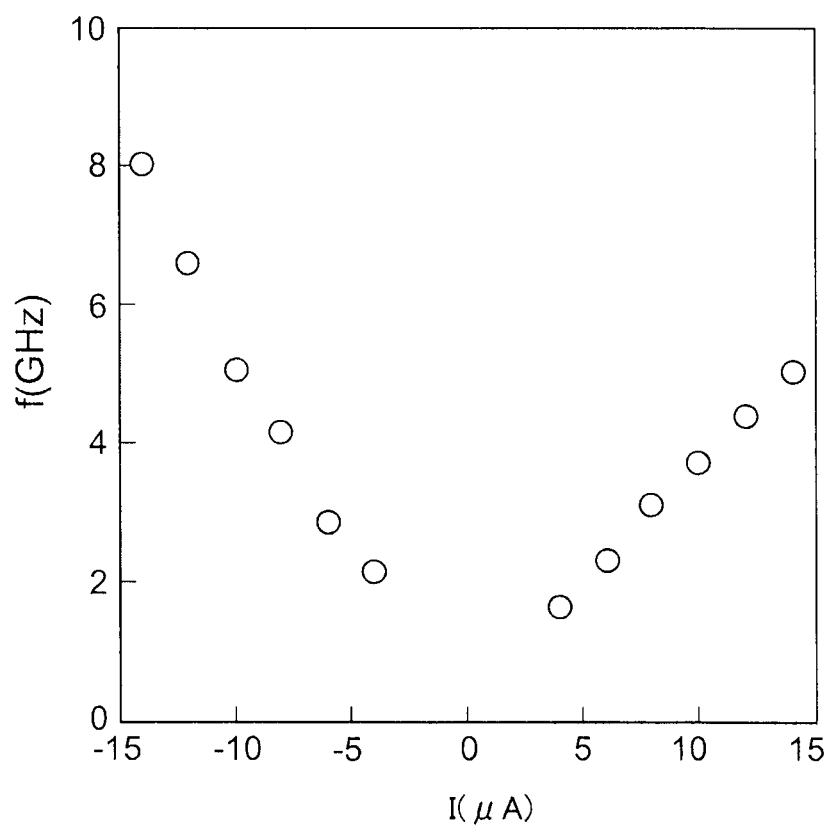
FIG. 19 is a graph illustrating the frequency response of a magnetic field occurring to a current in the second specific example.

FIG. 19 is a graph illustrating the frequency response of a magnetic field occurring to a current in the second specific example.

The horizontal axis and the vertical axis of the graph shown in FIG. 19 are similar to the horizontal axis and the vertical axis of the graph shown in FIG. 16, respectively.

Also in the second specific example, as described above in regard to FIG. 16, if a structure is employed in which the stray magnetic field from the first ferromagnetic layer 10a and the fourth ferromagnetic layer 10b is almost zero in the position of the second ferromagnetic layer 30, the stray magnetic field remains at the film surface in the downward direction in the position of the third ferromagnetic layer 50. In this case, the frequency f of the rotating magnetic field that the magnetic field generation source 5 generates exhibits a response asymmetric to the direction of the current I as shown in FIG. 19.

In the second specific example, the magnetic field generation source 5 was stacked on the magnetic recording unit as illustrated by the following conditions. The first ferromagnetic layer 10a (layer thickness: 5 nm) is a perpendicular magnetic film of Ms=1000 emu/cc, and Ku=8 Merg/cm$^3$. The first nonmagnetic layer 20a (layer thickness: 1 nm) is made of MgO. The second ferromagnetic layer 30 (layer thickness: 2 nm) is a perpendicular magnetic film of Ms=800 emu/cc, and Ku=3.3 Merg/cm$^3$. At this time, the resonance frequency of the second ferromagnetic layer 30 is 3.2 GHz. The fourth ferromagnetic layer 10b (layer thickness: 8 nm) is a perpendicular magnetic film of Ms=1000 emu/cc, and Ku=8 Merg/cm$^3$. The second nonmagnetic layer 20b (layer thickness: 8 nm) is made of Cu. The third ferromagnetic layer 50 (layer thickness: 3 nm) is an in-plane magnetic film of Ku=5000 erg/cm$^3$.

Figure 20:
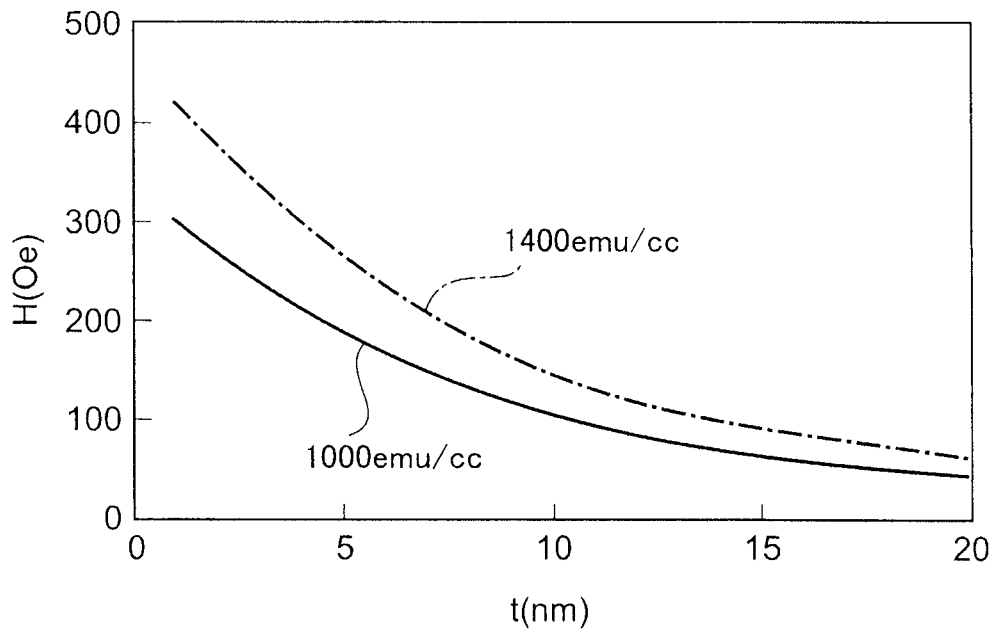
FIG. 20 is a graph illustrating a relationship between the layer thickness of the third nonmagnetic layer and magnetic field strength in the second specific example.

FIG. 20 is a graph illustrating a relationship between the layer thickness of the third nonmagnetic layer and magnetic field strength in the second specific example.

The horizontal axis and the vertical axis of the graph shown in FIG. 20 are similar to the horizontal axis and the vertical axis of the graph shown in FIG. 17, respectively. 1400 emu/cc and 1000 emu/cc in FIG. 20 express the Ms of the third ferromagnetic layer 50.

First, the layer thickness of the third nonmagnetic layer 40 was made 8 nm. The time in which the magnetization 32 of the second ferromagnetic layer 30 was reversed from the antiparallel state to the parallel state when there was only the magnetic recording unit 3 was 8.6 ns when a current of 7 μA was passed. In contrast, it has been found out that it was 5.2 ns in the second specific example. On the other hand, in the case where the direction in which the magnetization 32 of the second ferromagnetic layer 30 precesses and the direction of the rotating magnetic field that the third ferromagnetic layer 50 generates do not agree, the time in which the magnetization 32 was reversed from the antiparallel state to the parallel state was 9.6 ns when a current of 7 μA was passed. Thus, it has been found out that magnetization reversal efficiency increases in the case where the direction of the rotating magnetic field and the direction in which the magnetization 32 of the second ferromagnetic layer 30 precesses agree. As a consequence, the writing of data can be performed with a smaller current.

Next, the layer thickness of the third nonmagnetic layer 40 was made 2 nm. The time in which the magnetization 32 of the second ferromagnetic layer 30 was reversed from the antiparallel state to the parallel state when there was only the magnetic recording unit 3 was 8.6 ns when a current of 7 μA was passed. In contrast, it has been found out that it was 1.6 ns in the second specific example. On the other hand, in the case where the direction in which the magnetization 32 of the second ferromagnetic layer 30 precesses and the direction of the rotating magnetic field that the third ferromagnetic layer 50 generates do not agree, the time in which the magnetization 32 was reversed from the antiparallel state to the parallel state was 7.8 ns when a current of 7 μA was passed. By placing the magnetic field generation source 5 nearer to the magnetic recording unit 3, magnetization reversal efficiency has increased. Thus, it has been found out that magnetization reversal efficiency increases in the case where the direction of the rotating magnetic field and the direction in which the magnetization 32 of the second ferromagnetic layer 30 precesses agree. As a consequence, the writing of data can be performed with a smaller current.

Figure 21:
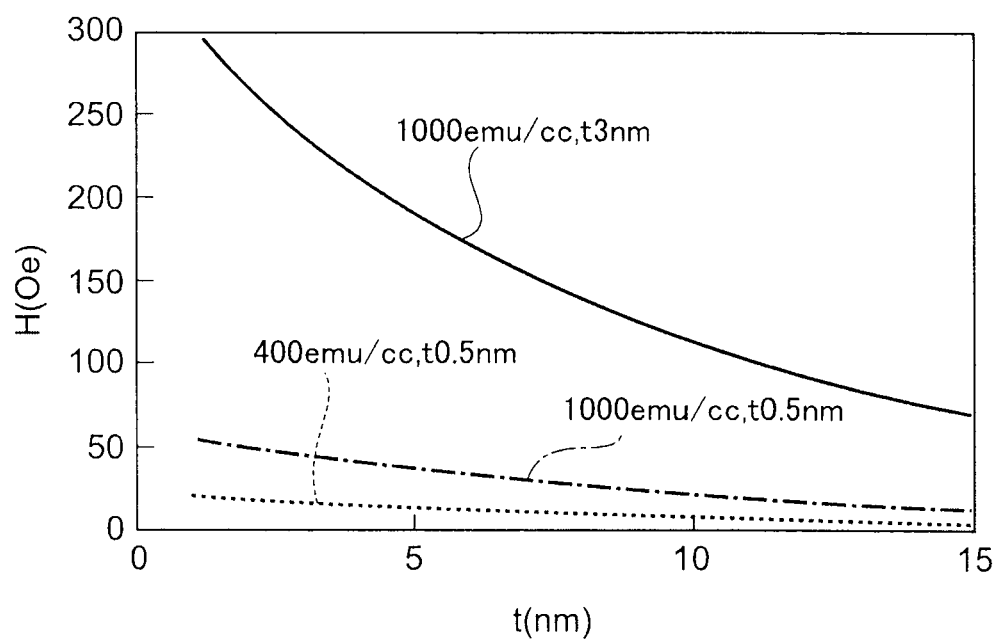
FIG. 21 is a graph illustrating a relationship between the layer thickness of the third nonmagnetic layer and magnetic field strength under other conditions of the specific example.

FIG. 21 is a graph illustrating a relationship between the layer thickness of the third nonmagnetic layer and magnetic field strength under other conditions of the specific example.

The horizontal axis and the vertical axis of the graph shown in FIG. 21 are similar to the horizontal axis and the vertical axis of the graph shown in FIG. 17, respectively. 1000 emu/cc and 400 emu/cc in FIG. 21 express the Ms of the third ferromagnetic layer 50. "t3nm" in FIG. 21 means that the third ferromagnetic layer 50 has a layer thickness of 3 nm, and "t0.5nm" means that the third ferromagnetic layer 50 has a layer thickness of 0.5 nm.

The conditions of the components in the graph shown in FIG. 21 are as follows. The third ferromagnetic layer 50 has a diameter of 20 nm. The fourth ferromagnetic layer 10b (layer thickness: 5 nm) is a perpendicular magnetic film of Ms=1000 emu/cc, and Ku=8 Merg/cm$^3$. The second nonmagnetic layer 20b (layer thickness: 2 nm) is made of Cu. The third ferromagnetic layer 50 (layer thickness: 3 nm and layer thickness: 0.5 nm) is an in-plane magnetic film of Ku=5000 erg/cm$^3$. The first ferromagnetic layer 10a (layer thickness: 5 nm) is a perpendicular magnetic film of Ms=1000 emu/cc, and Ku=8 Merg/cm$^3$. The first nonmagnetic layer 20a (layer thickness: 1 nm) is made of MgO. The second ferromagnetic layer 30 (layer thickness: 2 nm) is a perpendicular magnetic film of Ms=800 emu/cc, and Ku=3.3 Merg/cm$^3$.

As shown in the graph shown in FIG. 15, strengths of several tens of oersteds (Oe) are enough to obtain the assist effect due to the rotating magnetic field. Such a film configuration as is described later in regard to FIG. 22 provides a larger magnetic field because the third ferromagnetic layer 50 and the second ferromagnetic layer 30 are closer to each other.

When the graphs shown in FIG. 20 and FIG. 21 which are the characteristics of a system satisfying the relation of $r<0.419t^2-2.86t+19.8$ and the graph shown in FIG. 17 which is the characteristics of a system not satisfying the relation of $r<0.419t^2-2.86t+19.8$ are compared, it is found out that the increase tendency of the magnetic field strength H by decreasing the size in the film surface perpendicular direction is significant in the case where the relation is satisfied. Thinning in the film surface perpendicular direction is preferable also from the viewpoint of element processing. Thus, it is preferable that the circle-equivalent diameter of the horizontal cross-sectional shape of the third ferromagnetic layer 50 will be within a range of not more than 35 nm and the layer thickness thereof will be within a range of 2±1.5 nm, to the extent that a sufficient magnetic field strength H to accelerate the magnetization reversal in the position of the second ferromagnetic layer 30 is ensured and the relation of $r<0.419t^2-2.86t+19.8$ is satisfied from the viewpoint of element processing.

The magnetic recording element of the specific example can be fabricated by a similar method to the magnetic recording element of the specific example described above in regard to FIG. 14 to FIG. 17. More specifically, a pillar of a Ta\Ru layer (a contact layer with the electrode, also functioning as a stopper layer), an FePt\CoFeB layer (the first ferromagnetic layer 10a of the magnetic recording unit 3), MgO (the first nonmagnetic layer 20a), a CoFeB\FePd layer (the second ferromagnetic layer 30 of the magnetic recording unit 3), Cu (the third nonmagnetic layer 40), an FePd\CoFe\Cu\Py layer (the magnetic field generation source 5), and Ru\Ta (a contact layer with the electrode) thereon is formed above a wafer via the lower electrode 100a for passing a current from the outside. Then, an element that allows a current to be passed from the outside via the upper electrode 100b is formed.

Next, still another specific example of the embodiment will now be described with reference to the drawings.

Figure 22A:
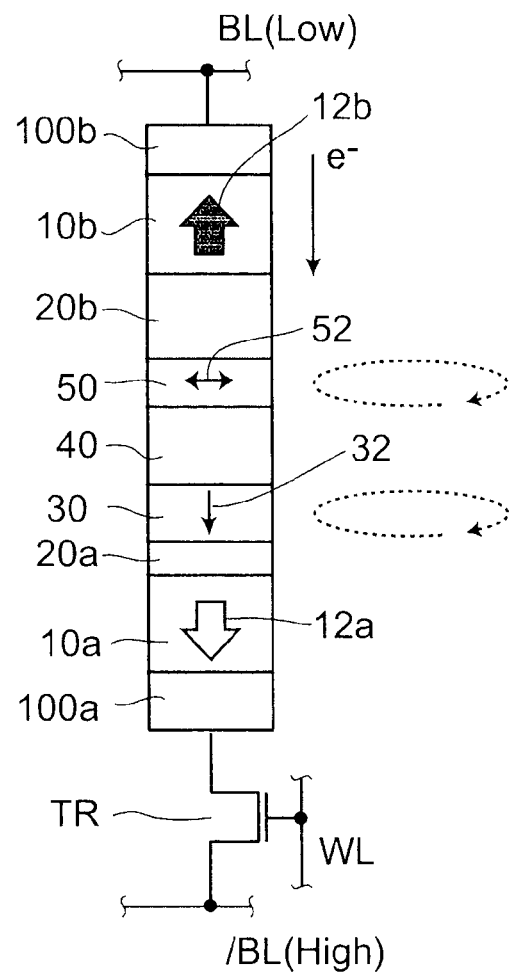
FIG. 22A and FIG. 22B are schematic cross-sectional views showing a magnetic recording element in a third specific example.
Figure 22B:
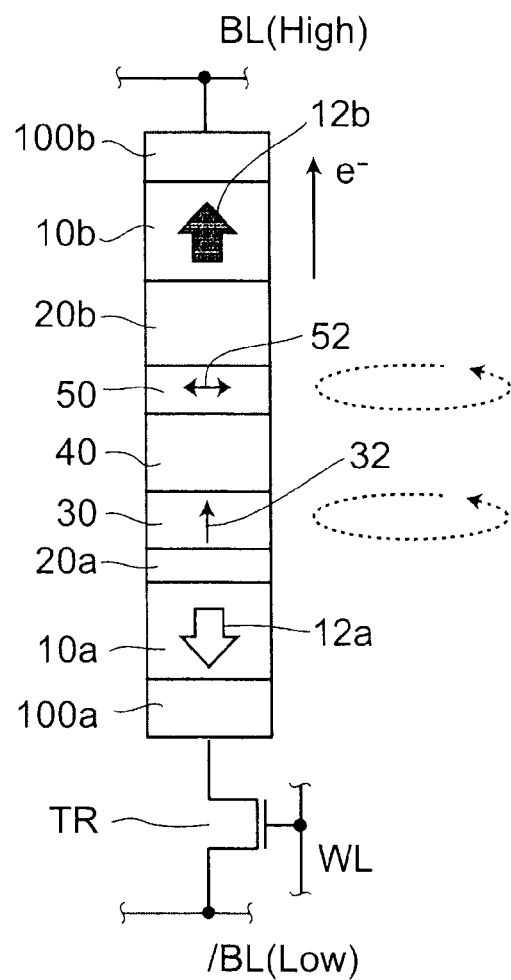

FIG. 22A and FIG. 22B are schematic cross-sectional views showing a magnetic recording element in a third specific example.

FIG. 22A is a schematic cross-sectional view showing the magnetic recording element in the case where electrons e⁻ flow from the upper electrode 100b toward the lower electrode 100a, and FIG. 22B is a schematic cross-sectional view showing the magnetic recording element in the case where electrons e⁻ flow from the lower electrode 100a toward the upper electrode 100b.

The stacked structure of the magnetic recording element in the third specific example is similar to the stacked structure of the magnetic recording element shown in FIG. 6B. Similarly to the specific example described above in regard to FIGS. 18A and 18B, the lower electrode 100a is provided below the second ferromagnetic layer 30. The upper electrode 100b is provided on the third ferromagnetic layer 50. The upper electrode 100b is connected to the bit line BL. The lower electrode 100a is connected to the drain terminal of the selection transistor TR. The gate terminal of the selection transistor TR is connected to the word line WL. The source terminal of the selection transistor TR is connected to the bit line /BL.

In the third specific example, ruthenium (Ru) with a short spin diffusion length is used as the third nonmagnetic layer 40. Thereby, the possibility can be decreased that the information of spin-transfer torque is transmitted between the third ferromagnetic layer 50 and the second ferromagnetic layer 30. Thus, the oscillation efficiency of the third ferromagnetic layer 50 will not be decreased.

Figure 23:
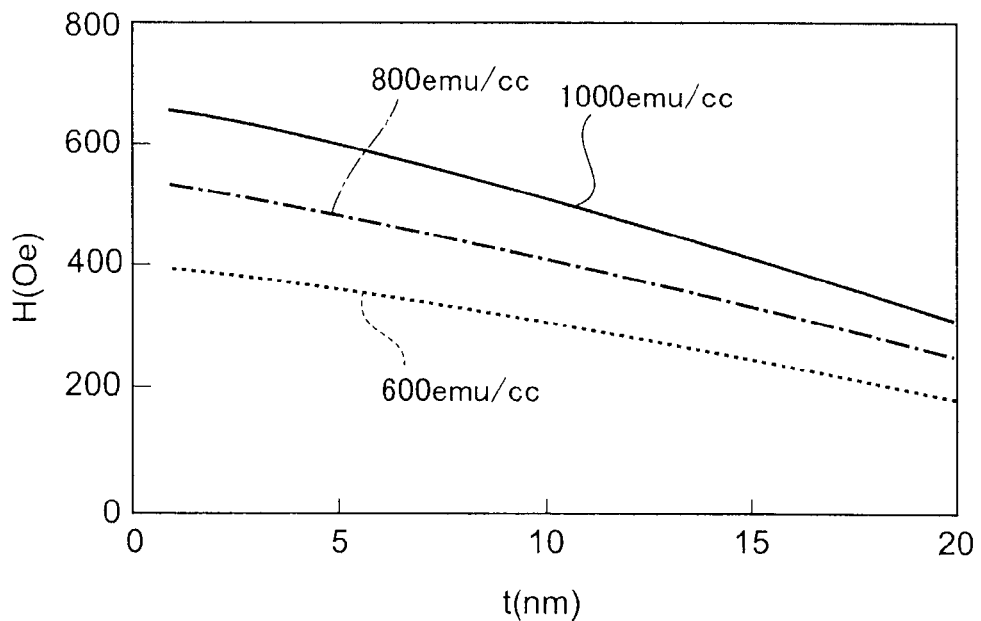
FIG. 23 is a graph illustrating a relationship between the layer thickness of the third nonmagnetic layer and magnetic field strength in the third specific example.

FIG. 23 is a graph illustrating a relationship between the layer thickness of the third nonmagnetic layer and magnetic field strength in the third specific example.

The horizontal axis and the vertical axis of the graph shown in FIG. 23 are similar to the horizontal axis and the vertical axis of the graph shown in FIG. 17, respectively. 1000 emu/cc, 800 emu/cc, and 600 emu/cc in FIG. 23 express the Ms of the third ferromagnetic layer 50.

In the third specific example, the horizontal cross-sectional shape of the second ferromagnetic layer 30 is a circle with a diameter of 50 nm. Furthermore, in the third specific example, the magnetic field generation source 5 is stacked above the magnetic recording unit 3 via the third nonmagnetic layer 40 as illustrated by the following conditions. The first ferromagnetic layer 10a (layer thickness: 5 nm) is a perpendicular magnetic film of Ms=1000 emu/cc, and Ku=8 Merg/cm³. The first nonmagnetic layer 20a (layer thickness: 1 nm) is made of MgO. The second ferromagnetic layer 30 (layer thickness: 2 nm) is a perpendicular magnetic film of Ms=800 emu/cc, and Ku=3.3 Merg/cm³. The fourth ferromagnetic layer 10b (layer thickness: 5 nm) is a perpendicular magnetic film of Ms=1000 emu/cc, and Ku=8 Merg/cm³. The second nonmagnetic layer 20b (layer thickness: 2 nm) is made of Cu. The third ferromagnetic layer 50 (layer thickness: 3 nm) is an in-plane magnetic film of Ku=5000 erg/cm³. It has been actually found out that the time in which the magnetization is reversed from the antiparallel state to the parallel state is shortened to 2.6 ns when the layer thickness of the ruthenium (Ru) of the third nonmagnetic layer 40 is made 8 nm and the Ms of the third ferromagnetic layer 50 is made 800 emu/cc.

Figure 24:
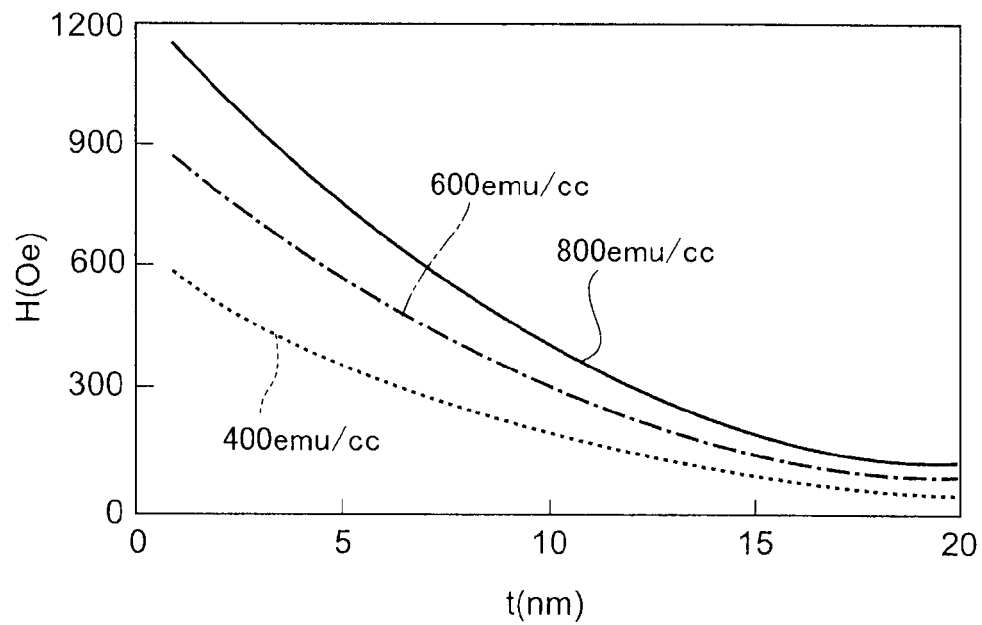
FIG. 24 is a graph illustrating a relationship between the layer thickness of the third nonmagnetic layer and magnetic field strength under other conditions of the third specific example.

FIG. 24 is a graph illustrating a relationship between the layer thickness of the third nonmagnetic layer and magnetic field strength under other conditions of the third specific example.

The horizontal axis and the vertical axis of the graph shown in FIG. 24 are similar to the horizontal axis and the vertical axis of the graph shown in FIG. 17, respectively. 800 emu/cc, 600 emu/cc, and 400 emu/cc in FIG. 24 express the Ms of the third ferromagnetic layer 50.

Herein, the horizontal cross-sectional shape of the second ferromagnetic layer is a circle with a diameter of 20 nm. In addition, herein the magnetic field generation source 5 is stacked above the magnetic recording unit 3 via the third nonmagnetic layer 40 as illustrated by the following conditions. The first ferromagnetic layer 10a (layer thickness: 5 nm) is a perpendicular magnetic film of Ms=1000 emu/cc, and Ku=8 Merg/cm³. The first nonmagnetic layer 20a (layer thickness: 1 nm) is made of MgO. The second ferromagnetic layer 30 (layer thickness: 2 nm) is a perpendicular magnetic film of Ms=800 emu/cc, and Ku=3.3 Merg/cm³. The third nonmagnetic layer 40 is made of ruthenium (Ru). The magnetic field generation source 5 has a diameter of 20 nm. The fourth ferromagnetic layer 10b (layer thickness: 5 nm) is a perpendicular magnetic film of Ms=1000 emu/cc, and Ku=8 Merg/cm³. The second nonmagnetic layer 20b (layer thickness: 2 nm) is made of Cu. The third ferromagnetic layer 50 (layer thickness: 3 nm) is an in-plane magnetic film of Ku=5000 erg/cm³.

The element with a diameter of 20 nm satisfies the relation of $r<0.419t^2-2.86t+19.8$. When the graph shown in FIG. 24 which is the characteristics of a system satisfying the relation and the graph shown in FIG. 23 which is the characteristics of a system not satisfying the relation are compared, it is found out that the increase tendency of the magnetic field strength H by decreasing the size in the film surface perpendicular direction is significant in the case where the relation is satisfied. Thinning in the film surface perpendicular direction is preferable also from the viewpoint of element processing. Thus, it is preferable that the diameter of the third ferromagnetic layer 50 will be within a range of not more than 35 nm and the layer thickness thereof will be within a range of 2±1.5 nm, to the extent that a sufficient magnetic field strength H to accelerate the magnetization reversal in the position of the second ferromagnetic layer 30 is ensured and the relation of $r<0.419t^2-2.86t+19.8$ is satisfied from the viewpoint of element processing.

The magnetic recording element in the third specific example can be fabricated by a similar method to the magnetic recording element of the specific example described above in regard to FIG. 14 to FIG. 17. More specifically, a pillar of a Ta\Ru layer (a contact layer with the electrode, also functioning as a stopper layer), an FePt\CoFeB layer (the first ferromagnetic layer 10a of the magnetic recording unit 3), MgO (the first nonmagnetic layer 20a), a CoFeB\FePd layer (the second ferromagnetic layer 30 of the magnetic recording unit 3), Ru (the third nonmagnetic layer 40), a Py\Cu\CoFeB\FePd layer (the magnetic field generation source 5), and Ru\Ta (a contact layer with the electrode) thereon is formed above a wafer via the lower electrode 100a for passing a current from the outside. Then, an element that allows a current to be passed from the outside via the upper electrode 100b is formed.

Figure 25:
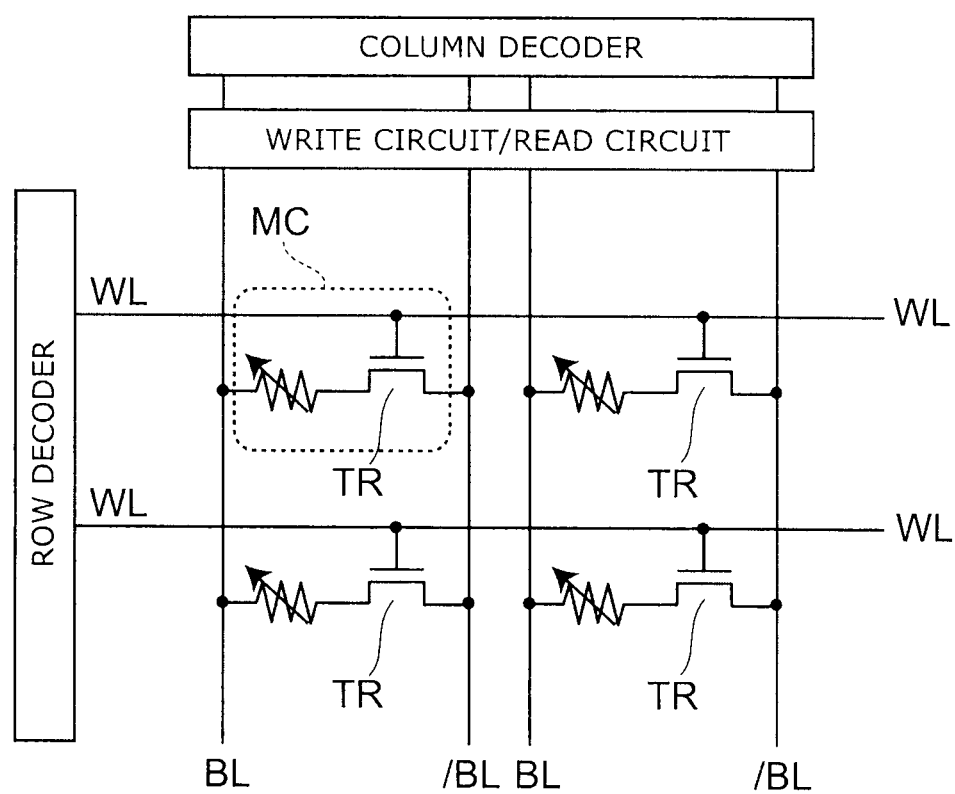
FIG. 25 is a schematic plan view showing a nonvolatile memory device in other specific examples of the first to fifth embodiments.

Next, yet another specific example of the first to fifth embodiments will now be described with reference to the drawings. FIG. 25 is a schematic plan view showing a nonvolatile memory device in the other specific example of the first to fifth embodiments.

The nonvolatile memory device of the specific example includes a memory cell array including memory cells MC arranged in a matrix configuration. Each memory cell MC includes one of the magnetic recording elements according to the embodiments described above in regard to FIG. 1A to FIG. 13 as an MTJ element.

A plurality of bit line pairs (the bit line BL and the bit line /BL) are arranged in the memory cell array so that each of them extends in the column direction. A plurality of word lines WL are arranged in the memory cell array so that each of them extends in the row direction.

The memory cell MC described above is placed at the intersection of the bit line BL and the word line WL. Each memory cell MC includes the MTJ element and the selection transistor TR. One end of the MTJ element is connected to the bit line BL. The other end of the MTJ element is connected to the drain terminal of the selection transistor TR. The gate terminal of the selection transistor TR is connected to the word line WL. The source terminal of the selection transistor TR is connected to the bit line /BL.

A row decoder is connected to the word line WL. A write circuit and a read circuit are connected to the bit line pair (the bit line BL and the bit line /BL). A column decoder is connected to the write circuit and the read circuit. Each memory cell MC is selected by the row decoder and the column decoder.

Data writing to the memory cell MC is performed as below. First, to select a memory cell MC on which data writing is performed, the word line WL connected to this memory cell MC is activated. The selection transistor TR thereby becomes ON.

Here, a bidirectional write current is supplied to the MTJ element. Specifically, in the case where a write current is supplied to the MTJ element from left to right, the write circuit applies a positive potential to the bit line BL and the ground potential to the bit line /BL. In the case where a write current is supplied to the MTJ element from right to left, the write circuit applies a positive potential to the bit line /BL and the ground potential to the bit line BL. Thus, the data "0" or the data "1" can be written to the memory cell MC.

Data reading from the memory cell MC is performed as below. First, a memory cell MC is selected. The read circuit supplies, for example, a read current flowing from right to left through the MTJ element. Then, the read circuit detects the resistance value of the MTJ element based on this read current. Thus, the information stored in the MTJ element can be read out.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic recording element comprising:
   a stacked body including:
      a first stacked unit including:
         a first ferromagnetic layer, magnetization of the first ferromagnetic layer being substantially fixed in a first direction being perpendicular to a first ferromagnetic layer surface;
         a second ferromagnetic layer recording data, a direction of magnetization of the second ferromagnetic layer being variable in directions perpendicular to a second ferromagnetic layer surface; and
         a first nonmagnetic layer provided between the first ferromagnetic layer and the second ferromagnetic layer; and
      a second stacked unit including:
         a third ferromagnetic layer generating a magnetic field during writing, a direction of magnetization of the third ferromagnetic layer being variable in directions parallel to a third ferromagnetic layer surface;
         a fourth ferromagnetic layer, magnetization of the fourth ferromagnetic layer being substantially fixed in a second direction being perpendicular to a fourth ferromagnetic layer surface; and
         a second nonmagnetic layer provided between the third ferromagnetic layer and the fourth ferromagnetic layer,
   the first direction being opposite to the second direction and
   an electron whose spin is polarized by passing a current in a direction substantially perpendicular to a film surface of each layer of the stacked body is caused to act on the second ferromagnetic layer and the magnetic field generated from a precession of a magnetization of the third ferromagnetic layer is caused to act on the second ferromagnetic layer to enable a direction of magnetization of the second ferromagnetic layer to be determined to a direction in accordance with a direction of the current.

2. The element according to claim 1, wherein the spin-polarized electron flows through the third ferromagnetic layer to cause the magnetization of the third ferromagnetic layer to precess when a current is passed in a direction substantially parallel to a stacking direction of the stacked body.

3. The element according to claim 2, wherein the current flows through the first ferromagnetic layer to generate the spin-polarized electron, the electron acts on the second ferromagnetic layer, and the electron flows through the third ferromagnetic layer to cause the magnetization of the third ferromagnetic layer to precess.

4. The element according to claim 3, wherein a direction in which magnetization of the third ferromagnetic layer precesses coincides with a direction in which magnetization of the second ferromagnetic layer precesses.

5. The element according to claim 1, further comprising a third nonmagnetic layer provided between the second ferromagnetic layer and the third ferromagnetic layer.

6. The element according to claim 5, wherein the second ferromagnetic layer, the first nonmagnetic layer, the first ferromagnetic layer, the third nonmagnetic layer, the fourth ferromagnetic layer, the second nonmagnetic layer, and the third ferromagnetic layer are sequentially stacked.

7. The element according to claim 5, wherein the first ferromagnetic layer, the first nonmagnetic layer, the second ferromagnetic layer, the third nonmagnetic layer, the third ferromagnetic layer, the second nonmagnetic layer, and the fourth ferromagnetic layer are sequentially stacked.

8. The element according to claim 5, wherein the second ferromagnetic layer, the first nonmagnetic layer, the first ferromagnetic layer, the third nonmagnetic layer, the third ferromagnetic layer, the second nonmagnetic layer, and the fourth ferromagnetic layer are sequentially stacked.

9. The element according to claim 5, wherein the first ferromagnetic layer, the first nonmagnetic layer, the second ferromagnetic layer, the third nonmagnetic layer, the fourth ferromagnetic layer, the second nonmagnetic layer, and the third ferromagnetic layer are sequentially stacked.

10. The element according to claim 1, wherein, assuming that a circle-equivalent diameter of a horizontal cross-sectional shape of the third ferromagnetic layer is R (nm), a value half of the R is r (nm), and a layer thickness of the third ferromagnetic layer is t (nm), the r and the t satisfy a relation of $$r<0.419t^2-2.86t+19.8$$

11. The element according to claim 1, further comprising a third nonmagnetic layer provided between the second ferromagnetic layer and the third ferromagnetic layer,
the third nonmagnetic layer is made of a metal including at least one selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two selected from the group.

12. The element according to claim 1, further comprising a third nonmagnetic layer provided between the second ferromagnetic layer and the third ferromagnetic layer,
the third nonmagnetic layer is made of a metal including at least one selected from the group consisting of ruthenium (Ru), osmium (Os), and iridium (Ir) or an alloy including at least two selected from the group, and
a layer thickness of the third nonmagnetic layer being not more than 3 nm.

13. The element according to claim 1, further comprising a third nonmagnetic layer provided between the second ferromagnetic layer and the third ferromagnetic layer,
the third nonmagnetic layer is made of a metal including at least one selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), bismuth (Bi), iridium (Ir), and osmium (Os) or an alloy including at least two selected from the group.

14. The element according to claim 1, wherein a circle-equivalent diameter of a horizontal cross-sectional shape of the third ferromagnetic layer is not more than 35 nm and a layer thickness of the third ferromagnetic layer is not less than 0.5 nm and not more than 3.5 nm.

15. The element according to claim 1, further comprising a protection layer covering a side surface of the stacked body.

16. The element according to claim 15, wherein the protection layer is made of an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe).

17. The element according to claim 1, further comprising a magnetic shield covering a side surface of the stacked body.

18. The element according to claim 17, wherein the magnetic shield is made of a soft magnet including at least one selected from the group consisting of iron (Fe), cobalt (Co), nickel (Ni), manganese (Mn), and chromium (Cr), an alloy by combination of at least one element selected from the group, or an alloy by combination of at least one element selected from the group consisting of iron (Fe), cobalt (Co), nickel (Ni), manganese (Mn), and chromium (Cr) and at least one element selected from the group consisting of platinum (Pt), palladium (Pd), iridium (Ir), ruthenium (Ru), and rhodium (Rh).

19. A nonvolatile memory device comprising:
a magnetic recording element;
a first interconnection connected to one end of the magnetic recording element; and
a second interconnection connected to another end of the magnetic recording element,
the magnetic recording element inclusing:
a stacked body including:
a first stacked unit including:
a first ferromagnetic layer, magnetization of the first ferromagnetic layer being substantially fixed in a first direction being perpendicular to a first ferromagnetic layer surface;
a second ferromagnetic layer recording data, a direction of magnetization of the second ferromagnetic layer being variable in directions perpendicular to a second ferromagnetic layer surface; and
a first nonmagnetic layer provided between the first ferromagnetic layer and the second ferromagnetic layer; and
a second stacked unit including:
a third ferromagnetic layer generating a magnetic field during writing, a direction of magnetization of the third ferromagnetic layer being variable in directions parallel to a third ferromagnetic layer surface;
a fourth ferromagnetic layer, magnetization of the fourth ferromagnetic layer being substantially fixed in a second direction being perpendicular to a fourth ferromagnetic layer surface; and
a second nonmagnetic layer provided between the third ferromagnetic layer and the fourth ferromagnetic layer,
the first direction being opposite to the second direction and
an electron spin-polarized by passing a current in a direction substantially perpendicular to a film surface of each layer of the stacked body being caused to act on the second ferromagnetic layer and the magnetic field generated by causing magnetization of the third ferromagnetic layer to precess being caused to act on the second ferromagnetic layer to enable a direction of magnetization of the second ferromagnetic layer to be determined to a direction in accordance with a direction of the current.

20. The device according to claim 19, further comprising a selection transistor provided at least one of between the magnetic recording element and the first interconnection and between the magnetic recording element and the second interconnection.

* * * * *